US012666846B2

(12) United States Patent
Park et al.

(10) Patent No.: US 12,666,846 B2
(45) Date of Patent: Jun. 23, 2026

(54) DISPLAY PANEL, METHOD OF MANUFACTURING THE DISPLAY PANEL, AND ELECTRONIC APPARATUS INCLUDING THE DISPLAY PANEL

(71) Applicant: Samsung Display Co., Ltd., Yongin-si (KR)

(72) Inventors: Sungsang Park, Yongin-si (KR); Duseok Kang, Yongin-si (KR); Yongmyeong Kim, Yongin-si (KR); Uikang Kim, Yongin-si (KR); Hyukjin Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 446 days.

(21) Appl. No.: 18/174,466

(22) Filed: Feb. 24, 2023

(65) Prior Publication Data

US 2023/0320178 A1     Oct. 5, 2023

(30) Foreign Application Priority Data

Apr. 4, 2022    (KR) ........................ 10-2022-0041910

(51) Int. Cl.
*H10K 59/80*      (2023.01)
*H10K 59/12*      (2023.01)
*H10K 59/40*      (2023.01)

(52) U.S. Cl.
CPC ....... *H10K 59/873* (2023.02); *H10K 59/1201* (2023.02); *H10K 59/40* (2023.02)

(58) Field of Classification Search
None
See application file for complete search history.

(56) References Cited

U.S. PATENT DOCUMENTS

| | | | |
|---|---|---|---|
| 10,658,617 B2 | 5/2020 | Kajiyama | |
| 11,183,673 B2 | 11/2021 | Park et al. | |
| 2017/0162637 A1* | 6/2017 | Choi | ........................ H01L 21/28 |
| 2018/0026226 A1* | 1/2018 | Choi | ................... H10K 59/873 |
| | | | 257/552 |

(Continued)

FOREIGN PATENT DOCUMENTS

| | | |
|---|---|---|
| CN | 108344378 A | 7/2018 |
| JP | 6815159 B2 | 4/2018 |

(Continued)

*Primary Examiner* — Kyoung Lee
(74) *Attorney, Agent, or Firm* — Womble Bond Dickinson (US) LLP

(57) ABSTRACT

A display panel includes a substrate including an opening, a light-emitting element arranged in a display area around the opening and including a first electrode, a second electrode, and an intermediate layer between the first electrode and the second electrode, at least one partition wall arranged in a first non-display area between the display area and the opening, a multi-layer insulating layer below the at least one partition wall, and an encapsulation layer on the light-emitting element and including at least one inorganic encapsulation layer and an organic encapsulation layer, wherein the second electrode extends toward the first non-display area from the display area, and the multi-layer insulating layer includes a recess portion located between an edge of the second electrode and the at least one partition wall in the first non-display area.

25 Claims, 24 Drawing Sheets

(56)                 References Cited

U.S. PATENT DOCUMENTS

| | | | |
|---|---|---|---|
| 2019/0074459 | A1 | 3/2019 | Kim et al. |
| 2020/0313101 | A1 | 10/2020 | Jung et al. |
| 2021/0234125 | A1 | 7/2021 | Sung et al. |
| 2021/0343813 | A1 | 11/2021 | Lee et al. |
| 2022/0102678 | A1 | 3/2022 | Kim et al. |

FOREIGN PATENT DOCUMENTS

| | | | |
|---|---|---|---|
| KR | 10-2017-0045459 | A | 4/2017 |
| KR | 10-2020-0002051 | A | 1/2020 |
| KR | 10-2020-0060636 | A | 6/2020 |
| KR | 10-2020-0111889 | A | 10/2020 |
| KR | 10-2020-0115834 | A | 10/2020 |

* cited by examiner

DISPLAY PANEL, METHOD OF MANUFACTURING THE DISPLAY PANEL, AND ELECTRONIC APPARATUS INCLUDING THE DISPLAY PANEL

CROSS-REFERENCE TO RELATED APPLICATION

This application claims priority to and the benefit of Korean Patent Application No. 10-2022-0041910, filed on Apr. 4, 2022, in the Korean Intellectual Property Office, the disclosure of which is incorporated by reference herein in its entirety.

BACKGROUND

1. Field

One or more embodiments relate to a display panel, a method of manufacturing the display panel, and an electronic apparatus including the display panel.

2. Description of the Related Art

Recently, the usage of display panels has diversified. In addition, as display panels have become thinner and lighter, their range of use has been gradually extended.

As the area occupied by a display area in display panels expands (e.g., increases), various functions that are combined or associated with display panels have been added. As alternatives for adding various functions while extending (e.g., increasing) the display area, research on utilizing a portion of the display area for functions other than displaying images has been pursued.

SUMMARY

Aspects according to one or more embodiments are directed toward a display panel including at least one opening arranged inside a display area, a method of manufacturing a display panel, and an electronic apparatus.

Additional aspects will be set forth in part in the description which follows and, in part, will be apparent from the description, or may be learned by practice of the presented embodiments of the disclosure.

According to one or more embodiments, a display panel includes: a substrate including an opening; a light-emitting element in a display area around the opening and including a first electrode, a second electrode, and an intermediate layer between the first electrode and the second electrode; at least one partition wall in a first non-display area between the display area and the opening; a multi-layer insulating layer below the at least one partition wall; and an encapsulation layer on the light-emitting element, and including at least one inorganic encapsulation layer and an organic encapsulation layer, wherein the second electrode extends toward the first non-display area from the display area, and the multi-layer insulating layer includes an recess portion located between an edge of the second electrode and the at least one partition wall in the first non-display area.

The multi-layer insulating layer may include a plurality of inorganic insulating layer.

The organic encapsulation layer may overlap the edge of the second electrode and the recess portion.

The intermediate layer may include an organic material layer extending toward the first non-display area from the display area, and a portion of the organic material layer may cover the recess portion in the first non-display area.

The organic material layer may include a plurality of first openings and a plurality of separation portions, wherein the plurality of first openings are spaced apart from each other in the first non-display area, and the plurality of separation portions are separated by the plurality of first openings.

At least one of the plurality of separation portions of the organic material layer may cover an upper surface and lateral surfaces of the at least one partition wall.

The at least one partition wall may include a first partition wall (that is) closest to the display area, and the recess portion may be located between an edge of the second electrode and the first partition wall in the first non-display area.

The at least one partition wall may further include a second partition wall and a third partition wall, wherein the second partition wall is closer to the opening of the substrate than the first partition wall is to the opening of the substrate, and the third partition wall is closer to the opening of the substrate than the second partition wall is to the opening of the substrate.

The multi-layer insulating layer may further include a crack-preventing recess portion located between the third partition wall and the opening of the substrate.

According to one or more embodiments, an electronic apparatus includes: a display panel including a transmissive area, a display area, and a first non-display area between the transmissive area and the display area; and a component below the display panel, the component corresponding to the transmissive area, wherein the display panel includes: a substrate having an opening corresponding to the transmissive area; a light-emitting element in the display area around the opening and including a first electrode, a second electrode, and an intermediate layer between the first electrode and the second electrode; at least one partition wall in the first non-display area between the display area and the opening; a multi-layer insulating layer below the at least one partition wall and including a plurality of inorganic insulating layers; and an encapsulation layer on the light-emitting element, and including at least one inorganic encapsulation layer and an organic encapsulation layer, wherein the second electrode extends toward the first non-display area from the display area, and the multi-layer insulating layer includes an recess portion located between an edge of the second electrode and the at least one partition wall in the first non-display area.

The component may include a camera and/or a sensor.

The organic encapsulation layer may overlap the edge of the second electrode and the recess portion.

The intermediate layer may include an organic material layer extending toward the first non-display area from the display area, and a portion of the organic material layer may cover the recess portion in the first non-display area.

The organic material layer may include a plurality of first openings and a plurality of separation portions, wherein the plurality of first openings are spaced apart from each other in the first non-display area, and the plurality of separation portions are separated by the plurality of first openings.

At least one of the plurality of separation portions of the organic material layer may cover an upper surface and lateral surfaces of the at least one partition wall.

The at least one partition wall may include a first partition wall closest to the display area, and the recess portion may be located between an edge of the second electrode and the first partition wall in the first non-display area.

The at least one partition wall may further include a second partition wall and a third partition wall, wherein the second partition wall is closer to the opening of the substrate than the first partition wall is to the opening of the substrate, and the third partition wall is closer to the opening of the substrate than the second partition wall is to the opening of the substrate.

The multi-layer insulating layer may further include a crack-preventing recess portion located between the third partition wall and the opening of the substrate.

According to one or more embodiments, a method of manufacturing a display panel includes: preparing a substrate including a transmissive area, a display area, and a first non-display area between the transmissive area and the display area; forming a multi-layer insulating layer on the substrate, the multi-layer insulating layer including a plurality of inorganic insulating layers; forming a recess portion indented in a thickness direction of the multi-layer insulating layer and located in the first non-display area; forming a light-emitting element including a first electrode, a second electrode, and an intermediate layer between the first electrode and the second electrode, wherein an organic material layer of the intermediate layer and the second electrode are formed in the display area and the first non-display area; forming at least one partition wall in the first non-display area; forming an encapsulation layer on the light-emitting element and including at least one inorganic encapsulation layer and an organic encapsulation layer; and removing at least a portion of the organic material layer and a portion of the second electrode arranged in the first non-display area, wherein an edge of the second electrode is located in the first non-display area, and the recess portion is between the edge of the second electrode and the at least one partition wall.

The removing may include irradiating a laser beam.

The removing may include: forming a plurality of first openings of the organic material layer by removing portions of the organic material layer located in the first non-display area, and wherein the organic material layer may include a plurality of separation portions separated from each other by the plurality of first openings.

The at least one partition wall may include a plurality of partition walls spaced apart from each other in the first non-display area, wherein one of the plurality of first openings is located between adjacent partition walls from among the plurality of partition walls.

A first opening closest to the display area from among the plurality of first openings may be located between the recess portion and the at least one partition wall.

The forming of the encapsulation layer may include: forming a first inorganic encapsulation layer in the display area and the first non-display area; forming the organic encapsulation layer on the first inorganic encapsulation layer; and forming a second inorganic encapsulation layer on the organic encapsulation layer, wherein the organic encapsulation layer may overlap the edge of the second electrode and the recess portion.

The forming of the recess portion may include forming a crack-preventing recess portion located between the at least one partition wall and the transmissive area.

These and/or other aspects should become apparent and more readily appreciated from the following detailed description of the embodiments, the accompanying drawings, and the claims.

BRIEF DESCRIPTION OF THE DRAWINGS

The above and other aspects, features, and enhancements of certain embodiments of the disclosure will be more

Figure 1A:
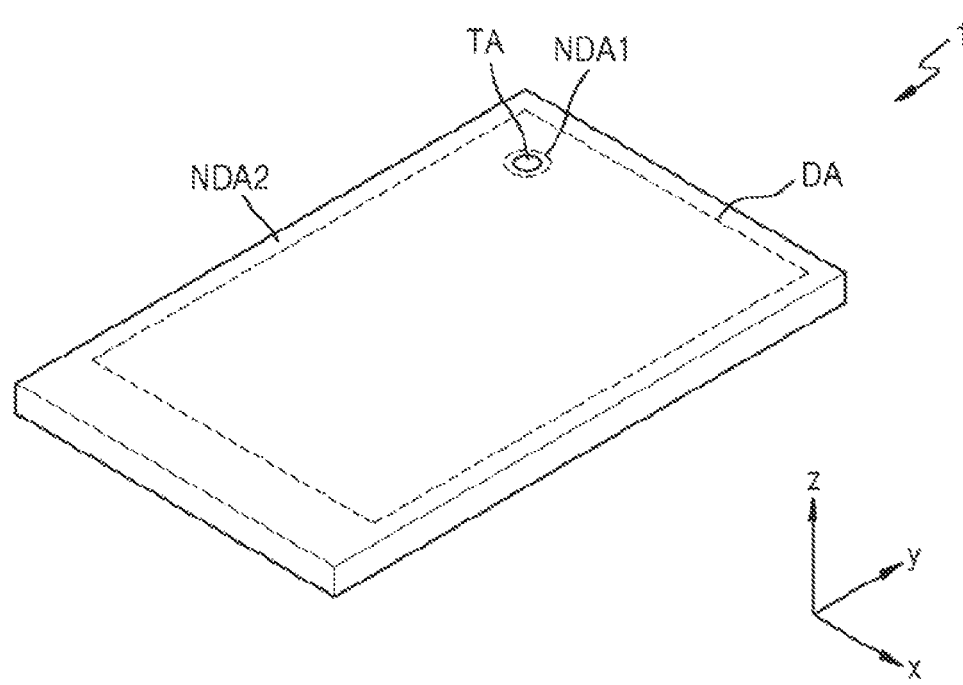
Figure 1B:
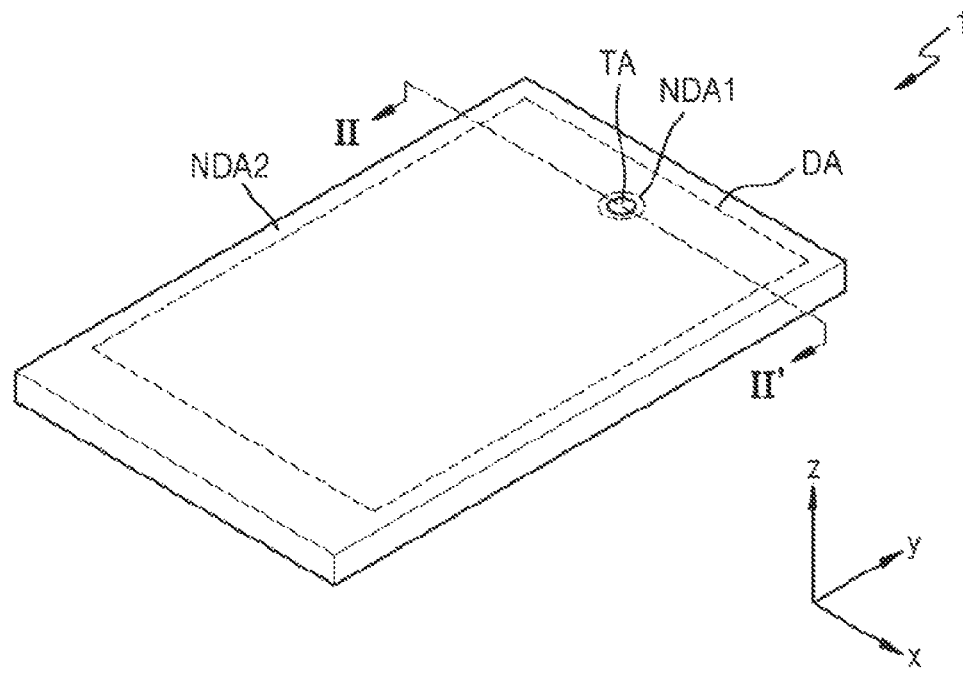
Figure 2:
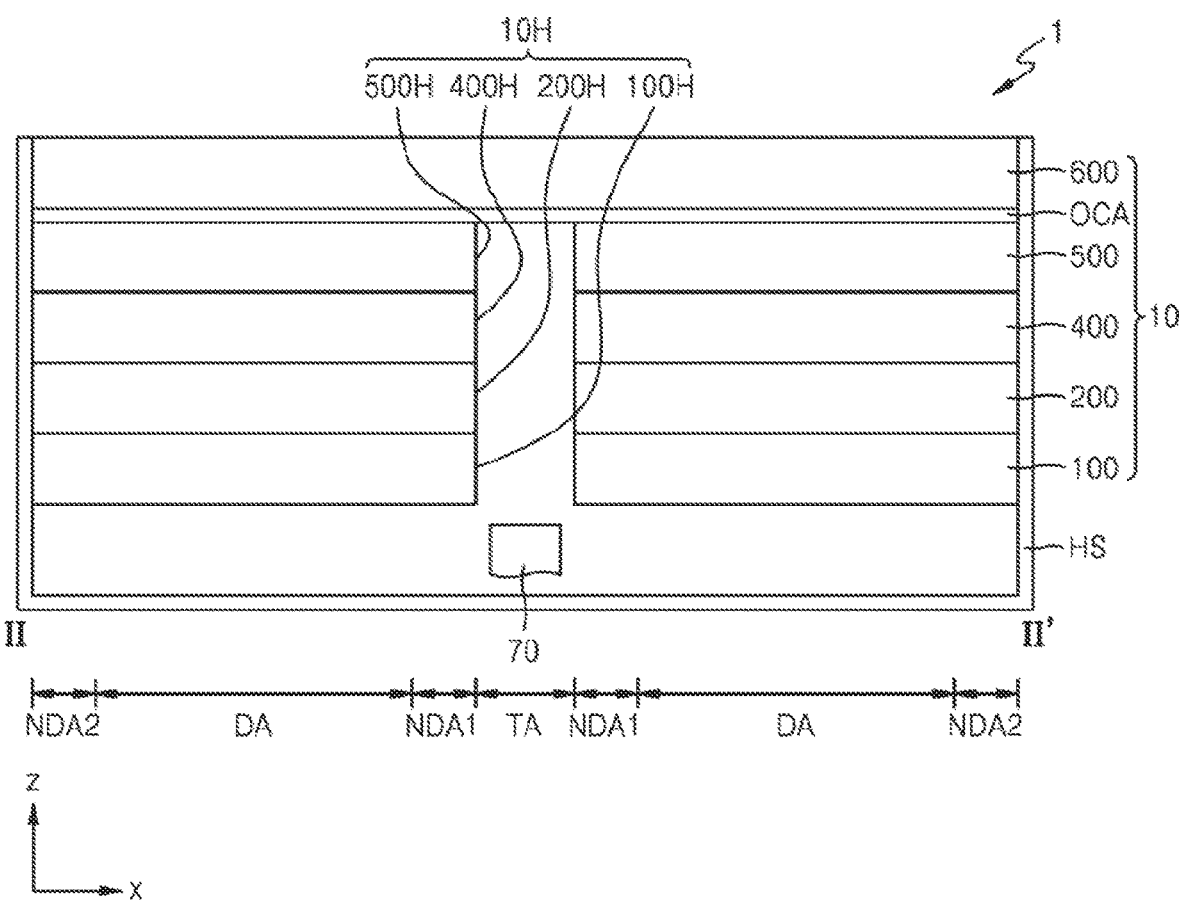
Figure 3A:
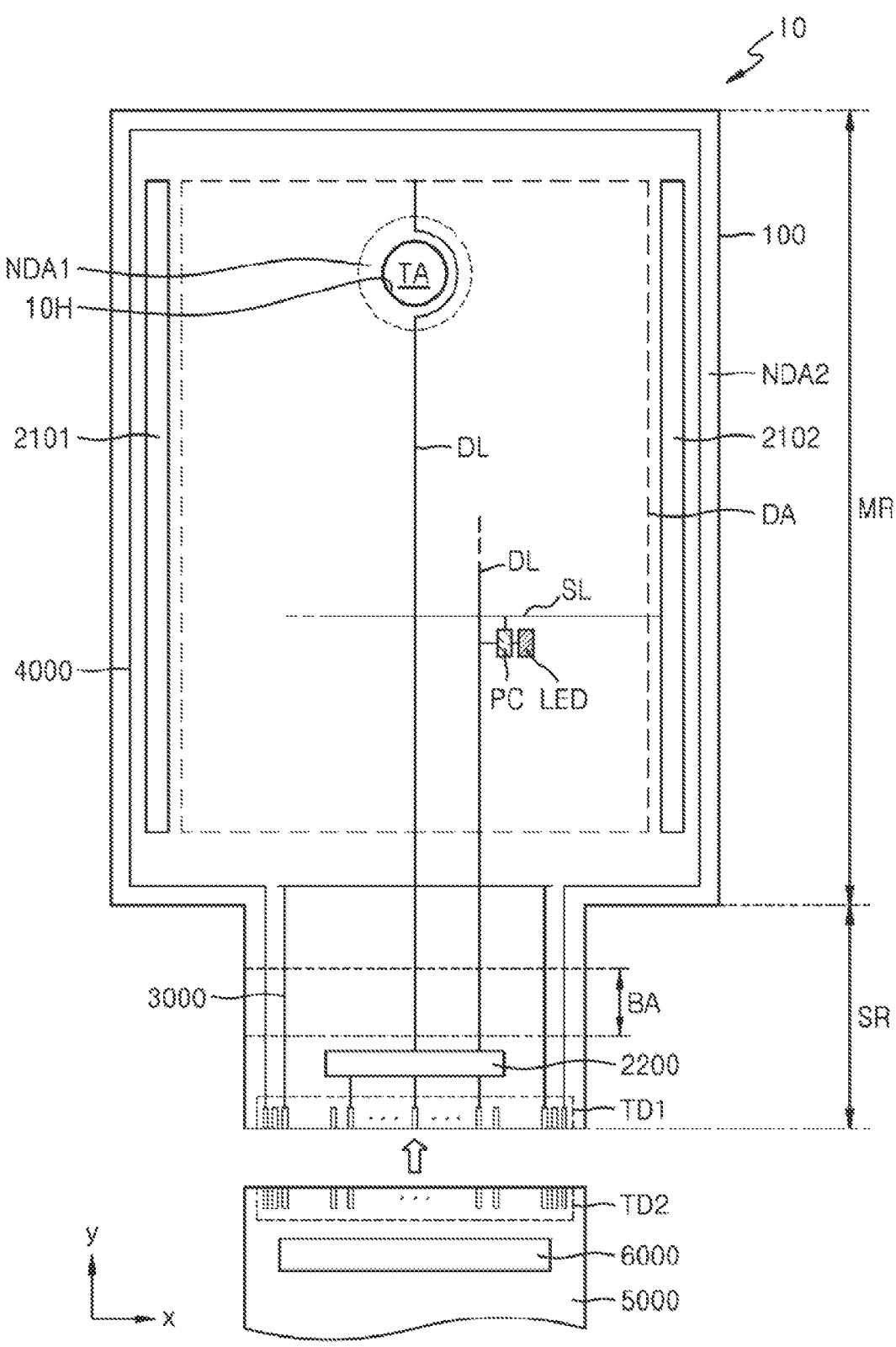
Figure 3B:
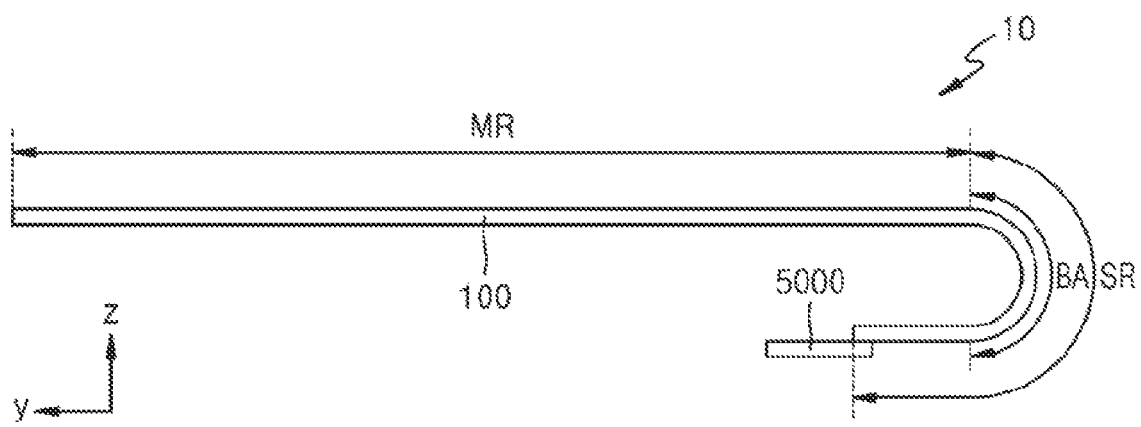
Figure 4A:
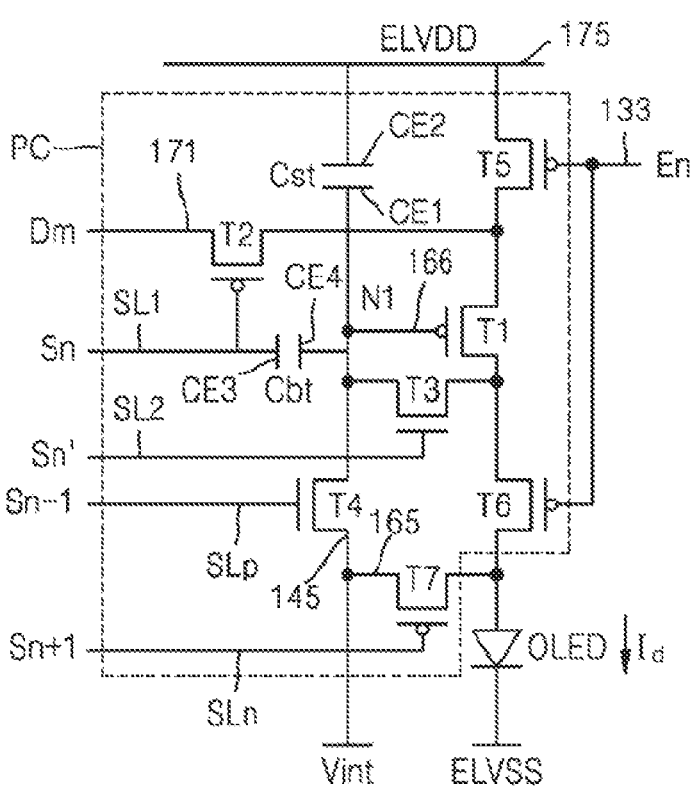
Figure 4B:
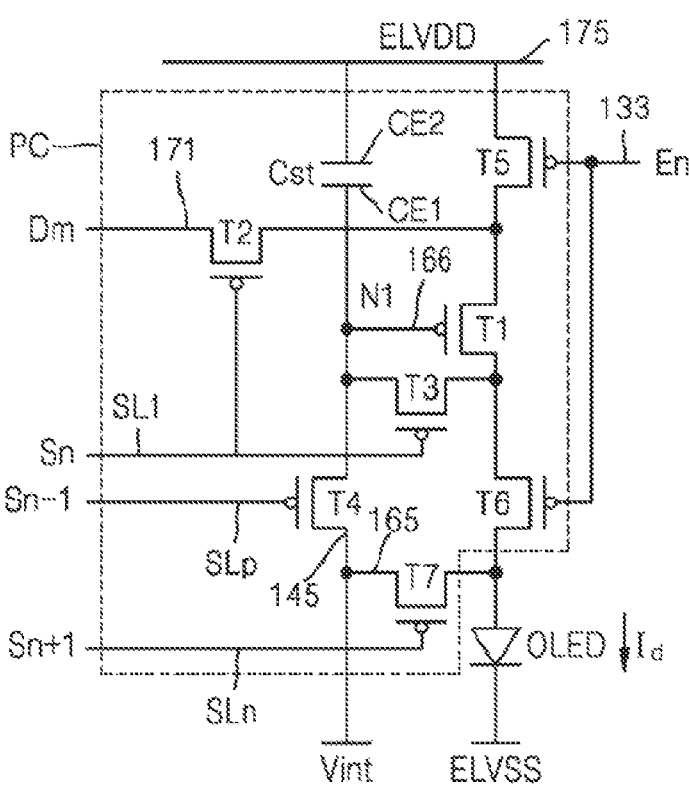
Figure 5:
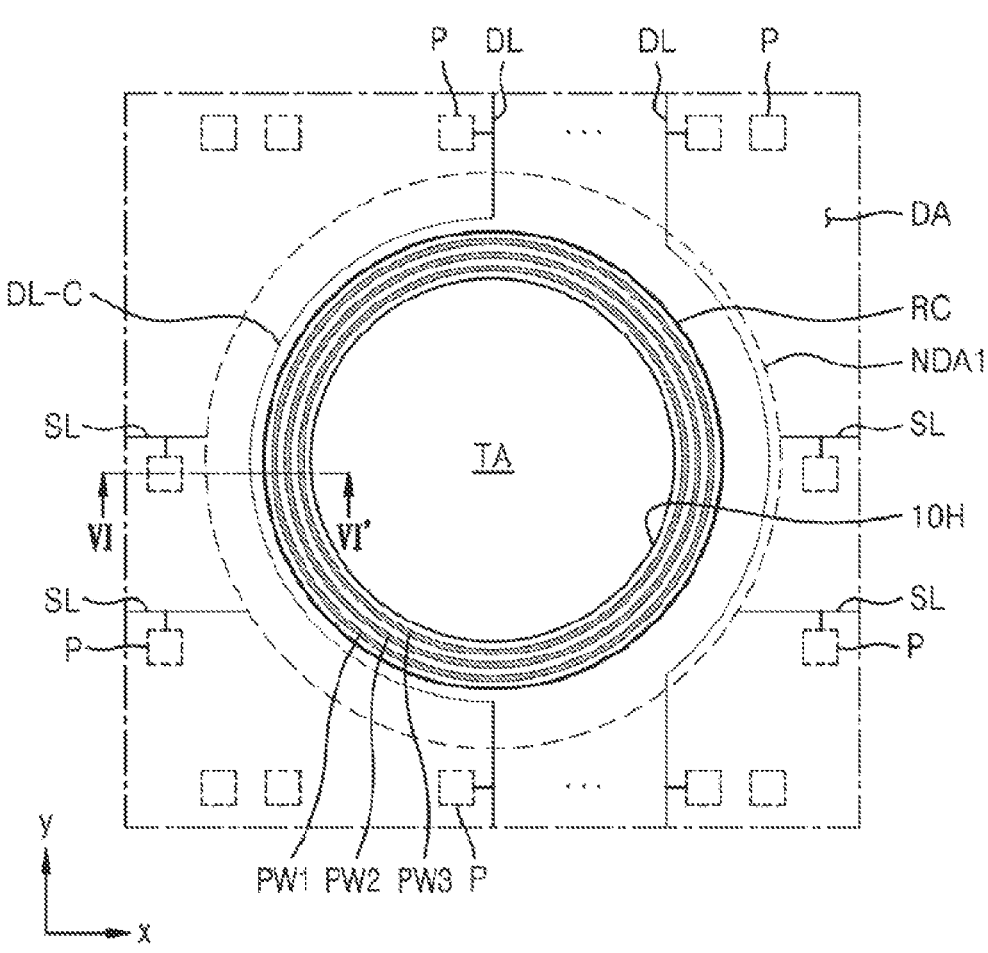
Figure 6:
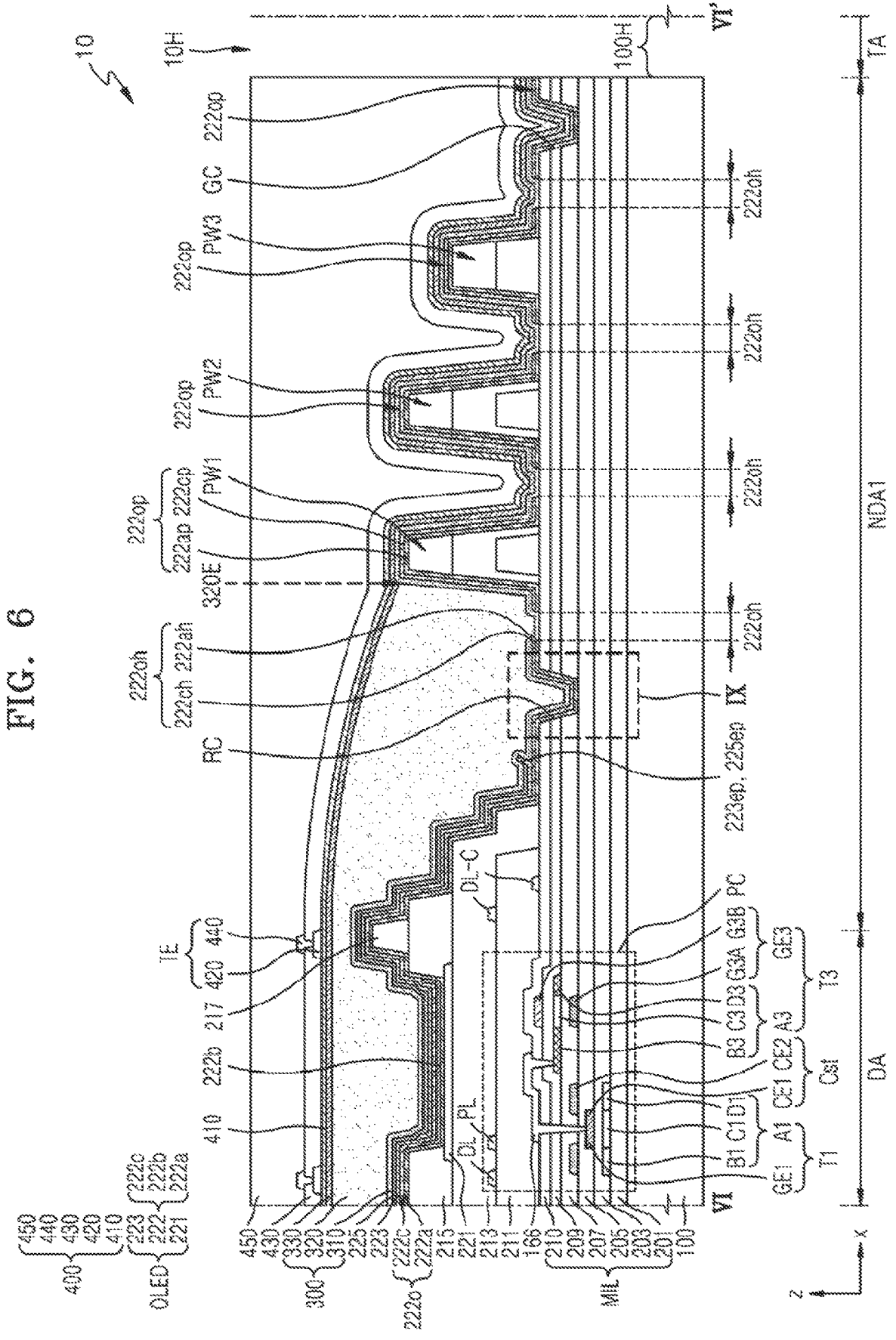
Figure 7:
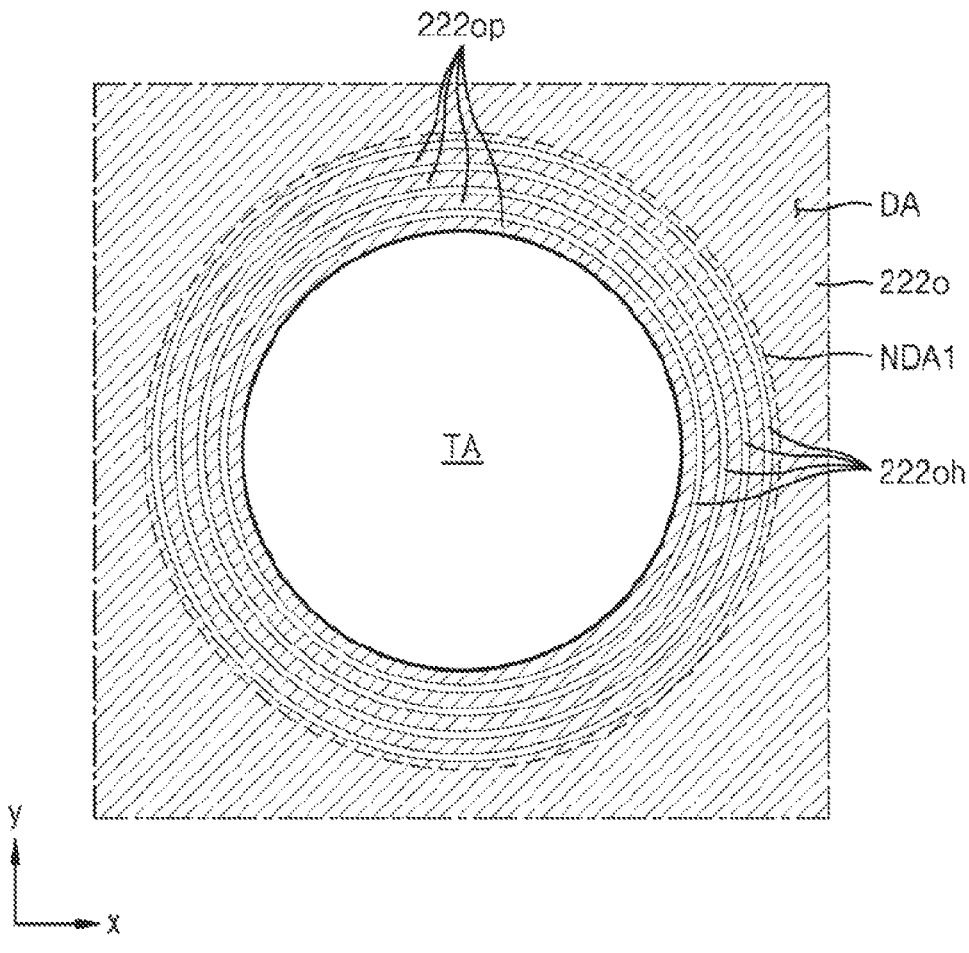
Figure 8:
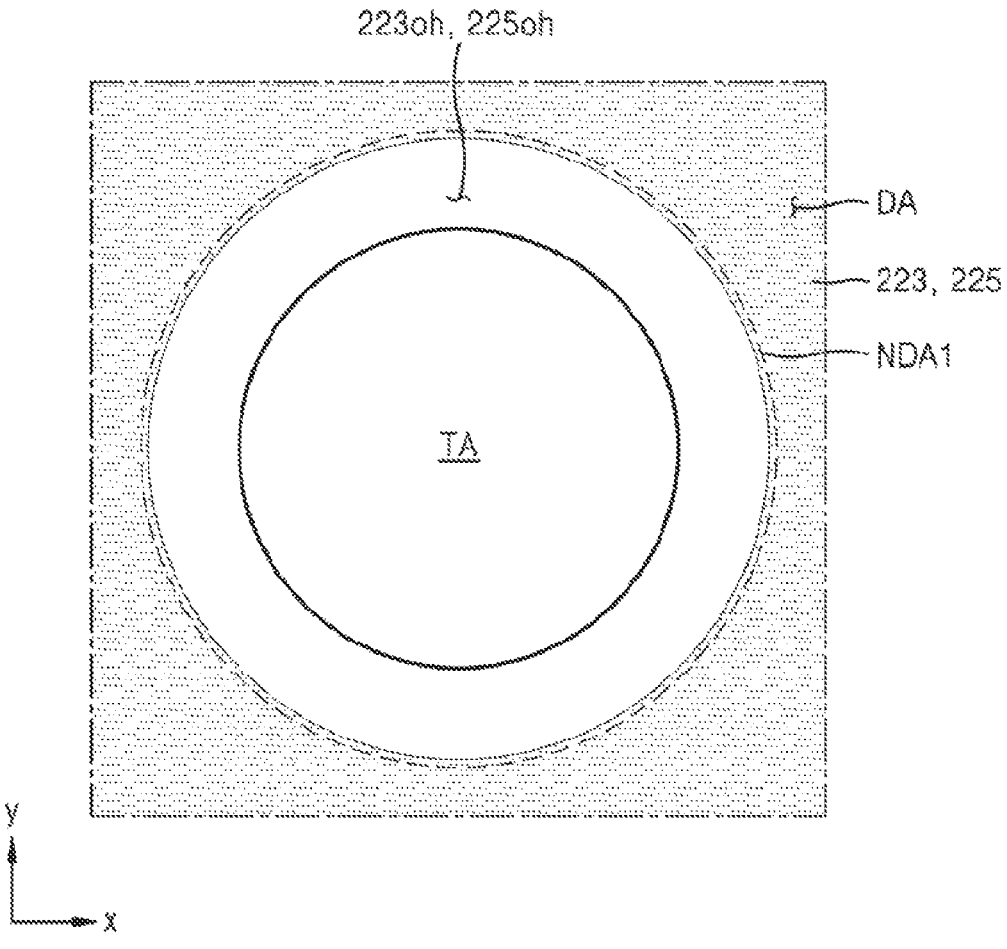
Figure 9:
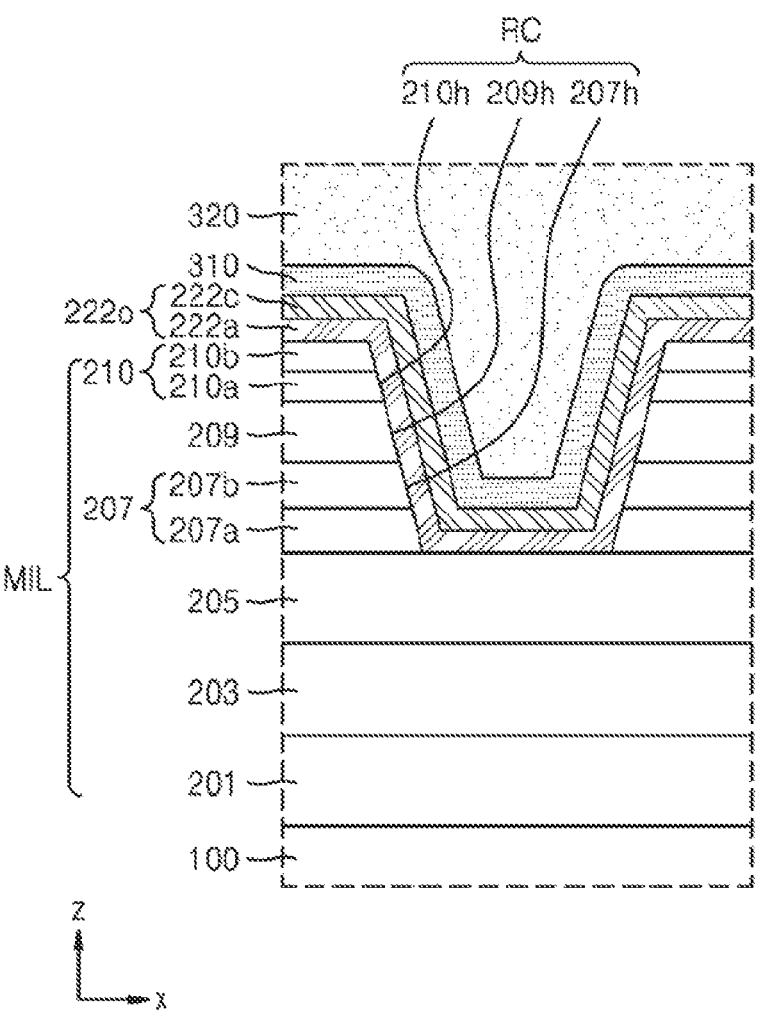
Figure 10A:
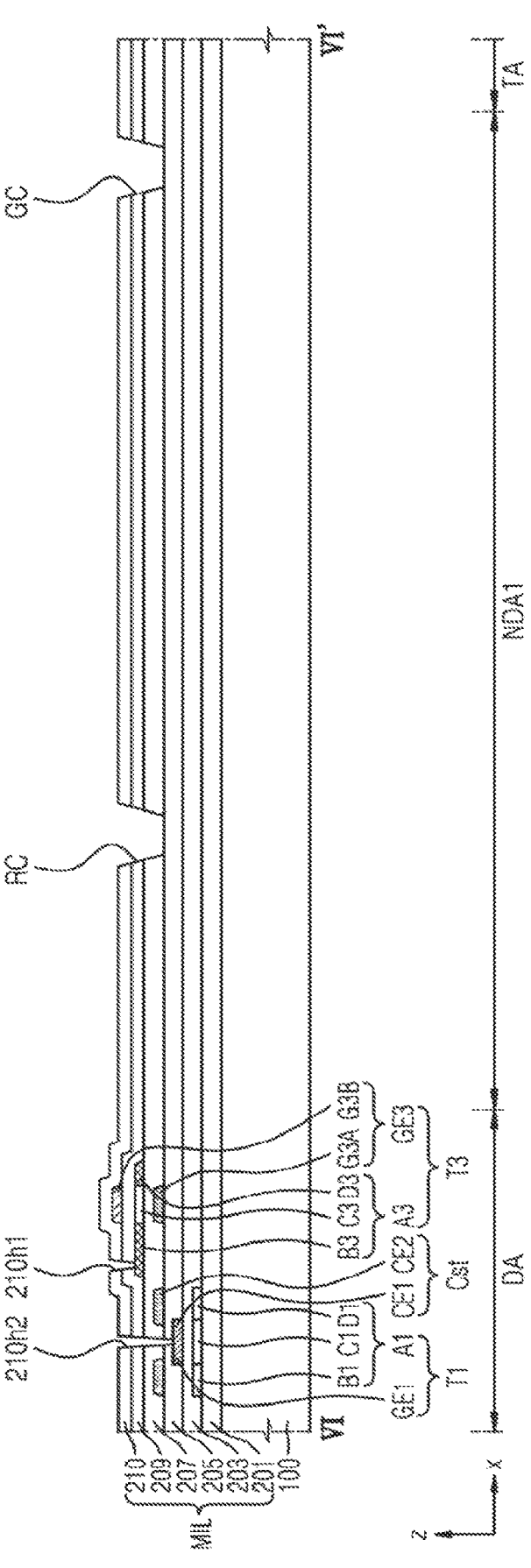
Figure 10B:
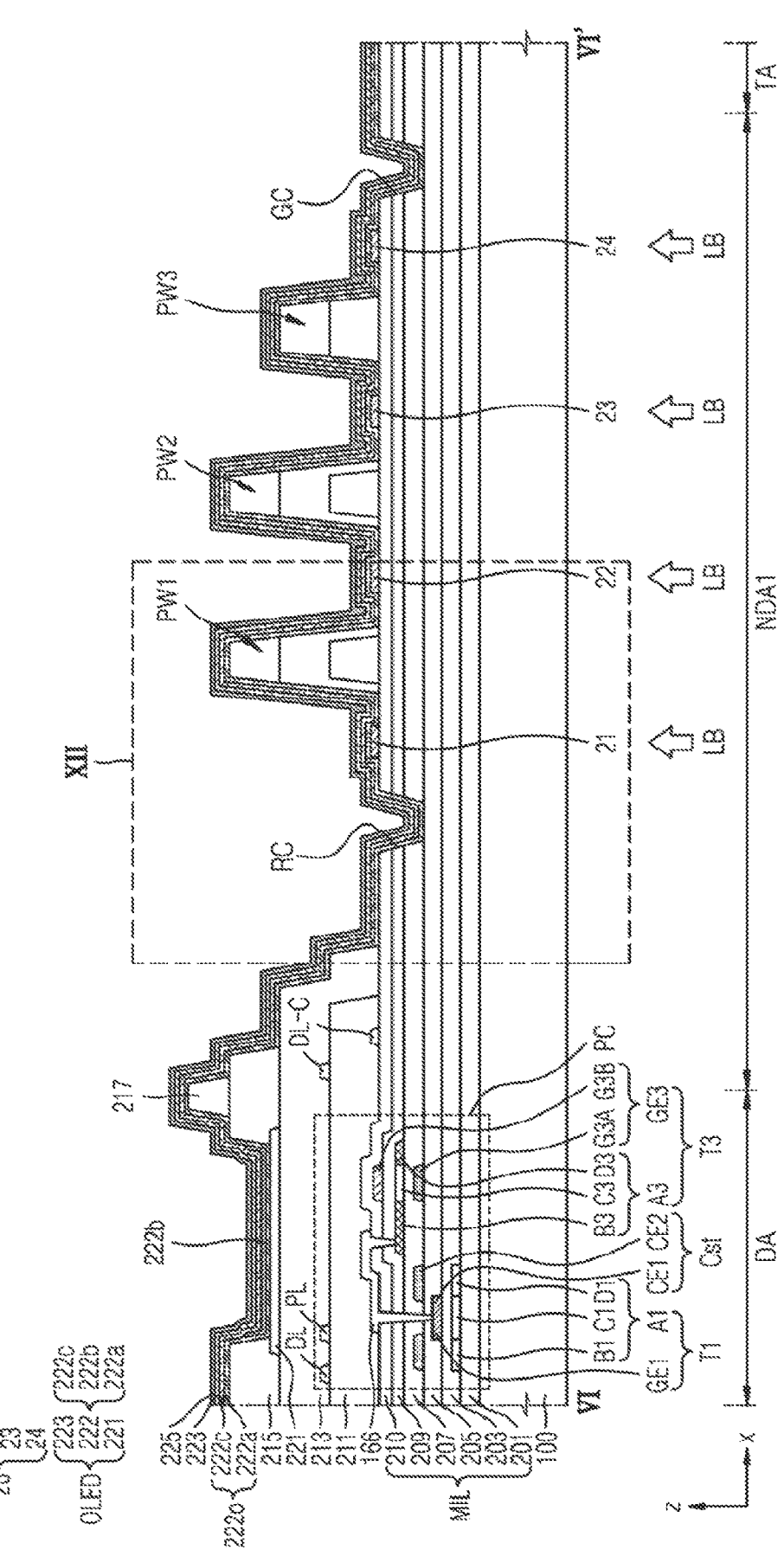
Figure 10C:
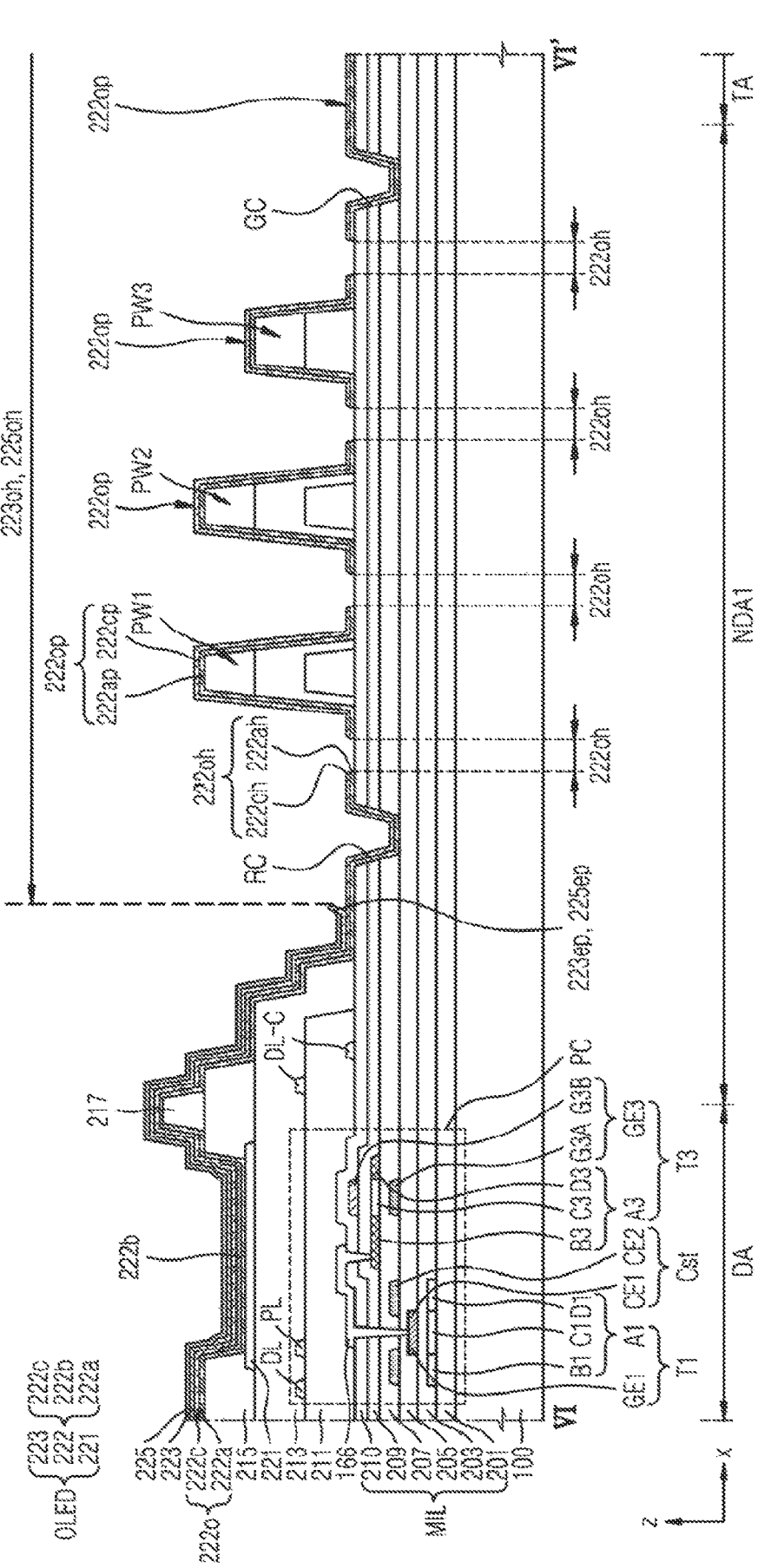
Figure 10D:
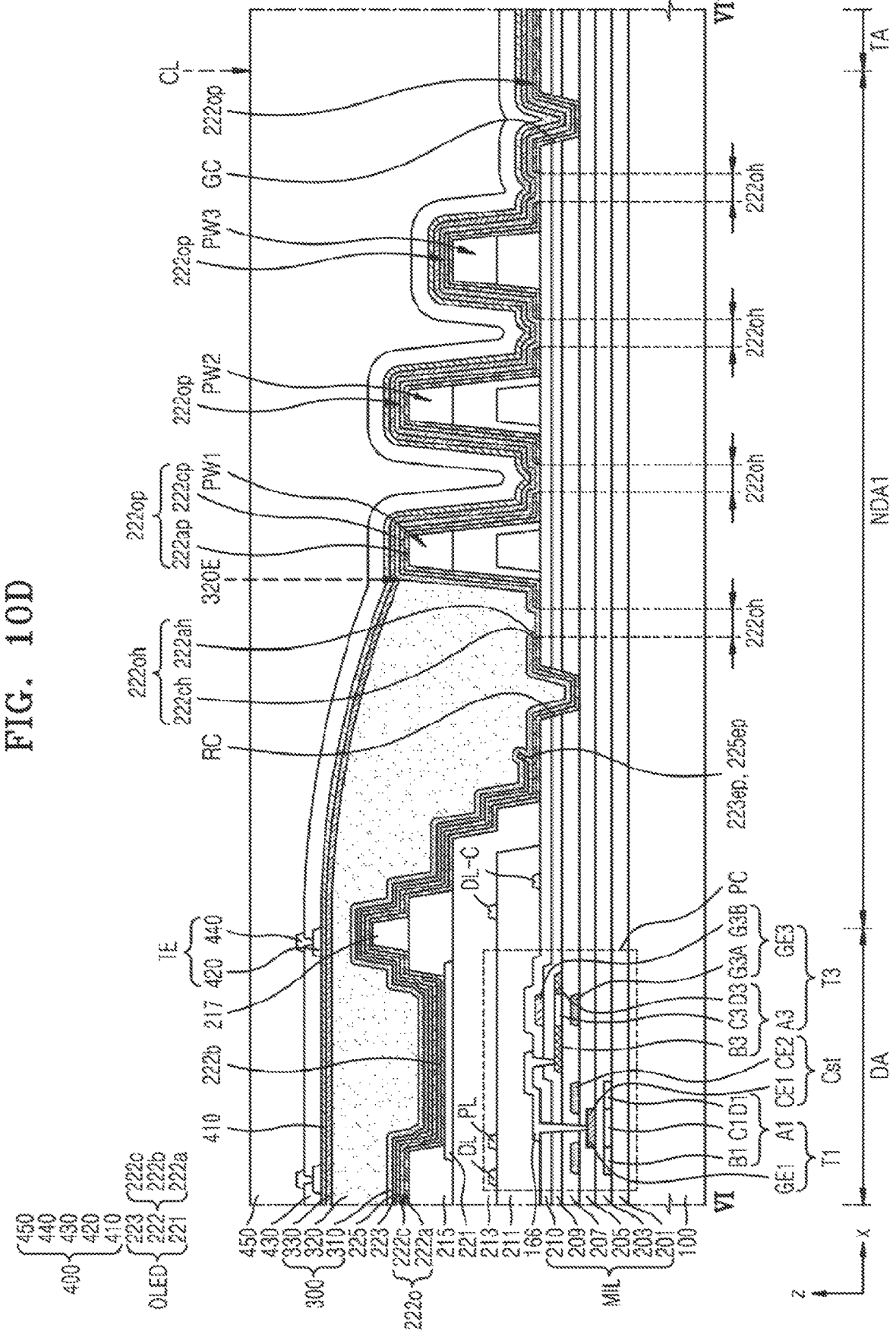
Figure 10E:
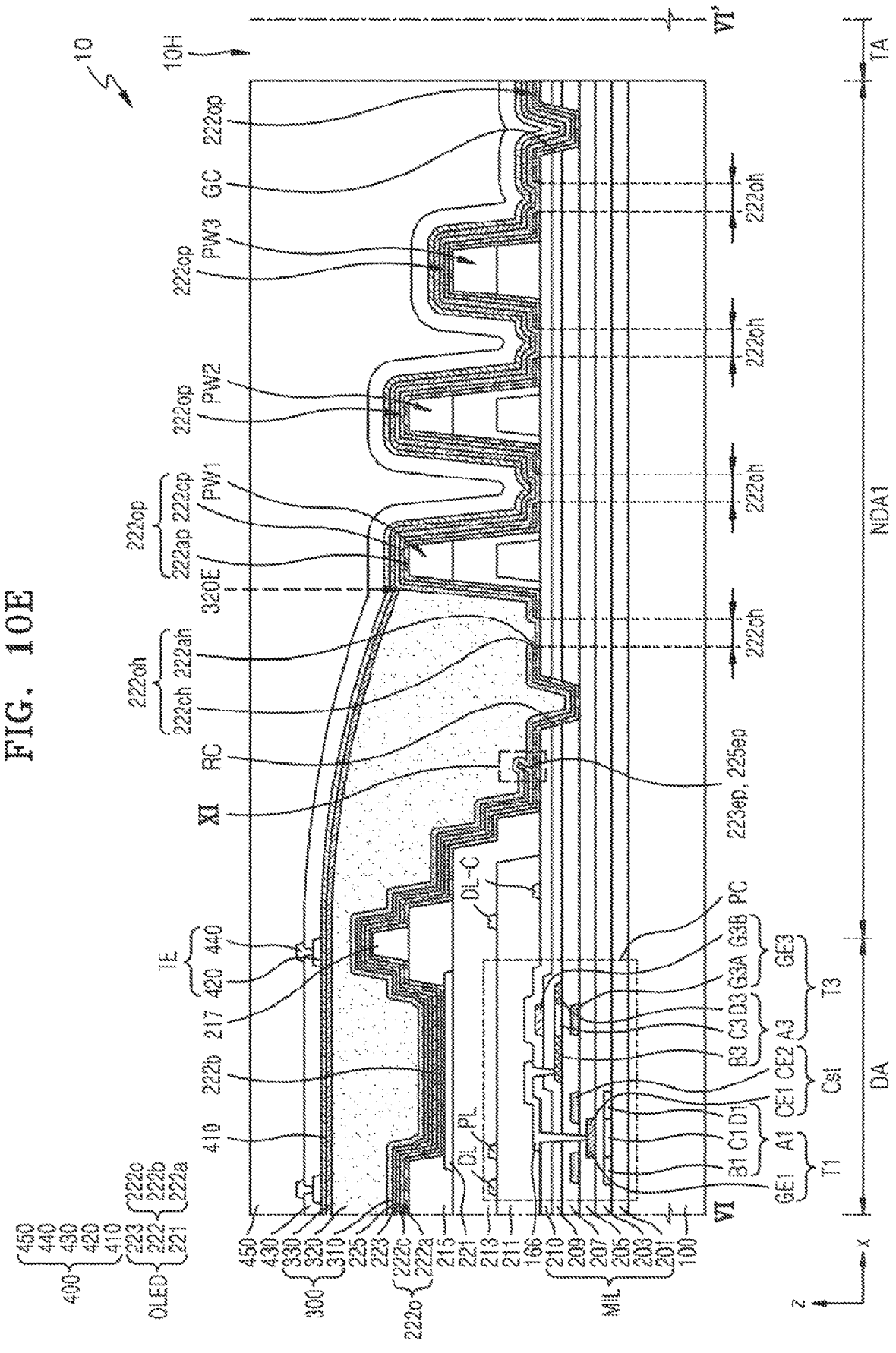
Figure 12:
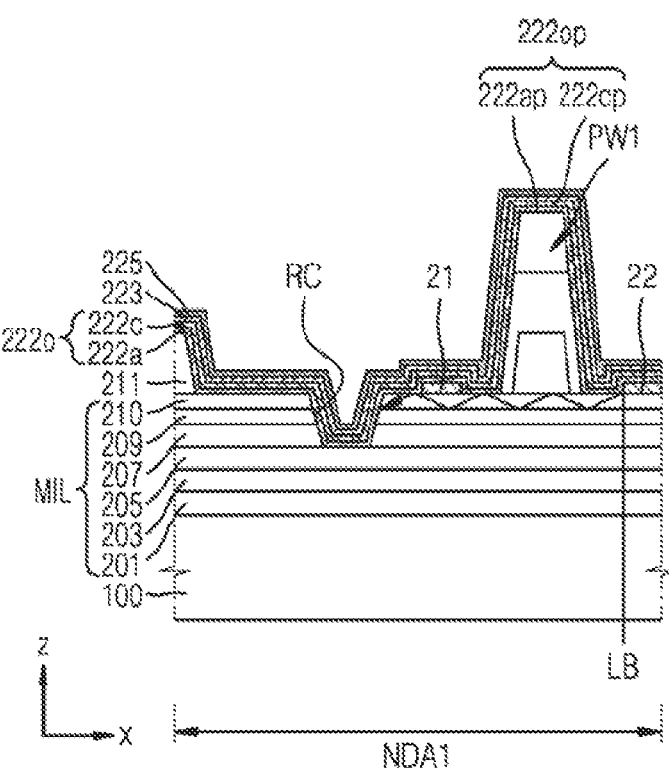
Figure 13:
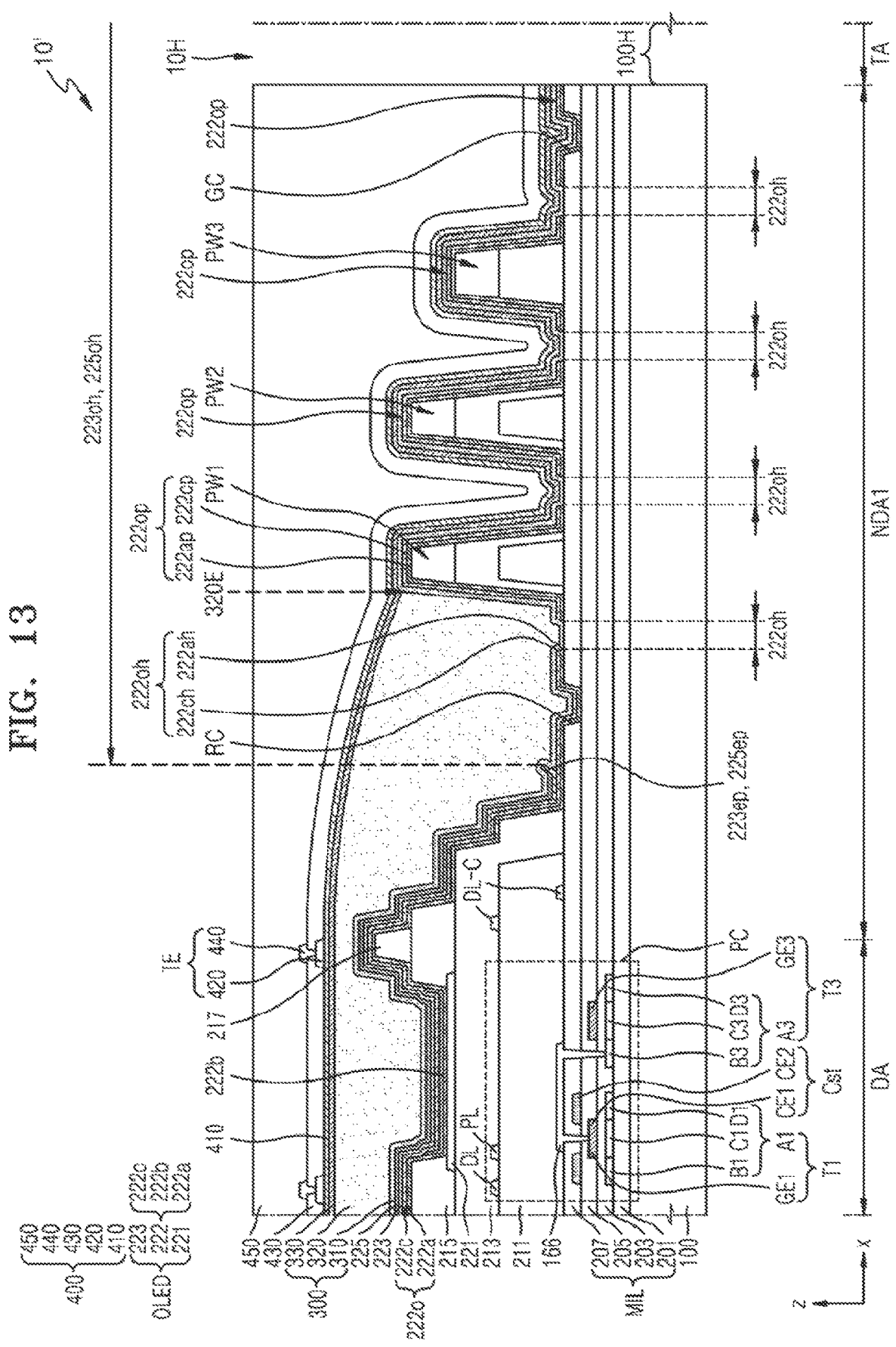
Figure 14:
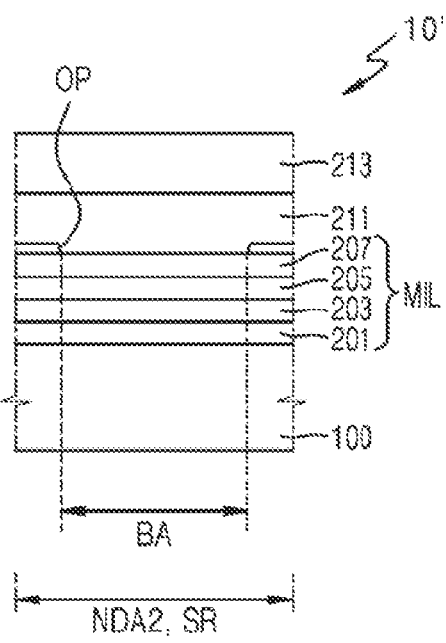

4 apparent from the following description taken in conjunction with the accompanying drawings, in which:

FIGS. 1A and 1B are each a schematic perspective view of an electronic apparatus according to a respective embodiment;

FIG. 2 is a schematic cross-sectional view of a display panel, taken along the line II-II' of FIG. 1B, according to an embodiment;

FIG. 3A is a schematic plan view of the display panel according to an embodiment, and FIG. 3B is a schematic side view of the display panel of FIG. 3A;

FIG. 4A is a diagram of an equivalent circuit connected to a light-emitting diode of the display panel according to an embodiment;

FIG. 4B is a diagram of an equivalent circuit connected to a light-emitting diode of the display panel according to another embodiment;

FIG. 5 is a plan view of a portion of the display panel according to an embodiment;

FIG. 6 is a schematic cross-sectional view of a display panel, taken along the line VI-VI' of FIG. 5, according to an embodiment;

FIG. 7 is a plan view of at least one organic material layer shown in FIG. 6;

FIG. 8 is a plan view of the second electrode shown in FIG. 6;

FIG. 9 is a cross-sectional view of the region IX of the display panel of FIG. 6;

FIGS. 10A-10E are cross-sectional views showing a process of manufacturing a display panel according to an embodiment;

FIGS. 11A-11D are cross-sectional images of the region XI of the display panel of FIG. 10E;

FIG. 12 is a cross-sectional view of the region XII of the display panel of FIG. 10B;

FIG. 13 is a schematic cross-sectional view of a display panel according to another embodiment; and FIG. 14 is a schematic cross-sectional view of a second display area of a display panel according to another embodiment.

DETAILED DESCRIPTION

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c", "at least one of a, b and/or c", "at least one selected from a, b, and c", "at least one selected from the group consisting of a, b, and c", etc., indicates only a, only b, only c, both a and b, both a and c, both b and c, all of a, b, and c, or variations thereof.

As the present disclosure allows for various suitable changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various suitable forms.

Hereinafter, embodiments will be described with reference to the accompanying drawings, wherein like reference numerals refer to like elements throughout and a repeated description thereof is omitted.

While terms such as "first" and/or "second" may be used to describe various components, such components must not be limited by the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings may be arbitrarily represented for convenience of description, and thus, the present disclosure is not necessarily limited thereto.

In the case where a certain embodiment may be implemented differently, a specific process order may be performed in the order different from the described order. As an example, two processes successively described may be simultaneously performed substantially or performed in the opposite order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

FIGS. 1A and 1B are each a schematic perspective view of an electronic apparatus 1 according to a respective embodiment.

Referring to FIGS. 1A and 1B, the electronic apparatus 1 may include an apparatus for displaying moving images and/or still images and may be utilized as a display screen of various suitable products including televisions, notebook computers, monitors, advertisement boards, Internet of things (IoT), as well as portable electronic apparatuses including mobile phones, smart phones, tablet personal computers (PC), mobile communication terminals, electronic organizers, electronic books, portable multimedia players (PMP), navigations, and/or ultra mobile personal computers (UMPC). In addition, the electronic apparatus 1 may be utilized in wearable devices including smartwatches, watchphones, glasses-type displays, and/or head-mounted displays (HMD). In addition, in an embodiment, the electronic apparatus 1 may be utilized as instrument panels for automobiles, center fascias for automobiles, and/or center information displays (CID) arranged on a dashboard, room mirror displays that replace side mirrors of automobiles, and/or displays arranged on the backside of front seats as an entertainment for back seats of automobiles. The electronic apparatus 1 may be bendable, foldable, and/or rollable. FIGS. 1A and 1B show, for convenience of description, the electronic apparatus 1 according to an embodiment as a smartphone.

The electronic apparatus 1 may have a rectangular shape in a plan view. In an embodiment, as an example, as shown in FIGS. 1A and 1B, the electronic apparatus 1 may have a quadrangular shape having short sides in the x direction and long sides in the y direction in a plan view. A corner where the short side in the x direction meets the long side in the y direction may be round to have a preset curvature or formed to have a right angle. A planar shape of the electronic apparatus 1 is not limited to rectangles, but may be other polygons, ellipses, or irregular shapes.

The electronic apparatus 1 may include a transmissive area TA (or a first region) and a display area DA (or a second region) at least partially around (e.g., surrounding) the transmissive area TA. The electronic apparatus 1 may include a first non-display area NDA1 (or a third region) and a second non-display area NDA2 (or a fourth region), wherein the first non-display area NDA1 is located between the transmissive area TA and the display area DA, and the second non-display area NDA2 is located outside the display area DA, for example, around (e.g., surrounding) the display area DA.

The transmissive area TA may be located inside (e.g., completely inside) the display area DA. In an embodiment, the transmissive area TA may be arranged on the upper left side of the display area DA as shown in FIG. 1A. In another embodiment, the transmissive area TA may be arranged on the upper center of the display area DA as shown in FIG. 1B. In another embodiment, the transmissive area TA may be arranged on the upper right side of the display area DA. However, various suitable modifications may be made. In the present specification, the terms "left," "right," "up," and "down" denote directions when the electronic apparatus 1 is viewed in a plan view in a direction perpendicular to the electronic apparatus 1. As an example, the term "left" denotes a −x direction, the term "right" denotes a +x direction, the term "up" denotes a +y direction, and the term "down" denotes a −y direction. Though it is shown in FIGS. 1A and 1B that one transmissive area TA is arranged (e.g., included), a plurality of transmissive areas TA may be arranged in another embodiment.

FIG. 2 is a schematic cross-sectional view of a display panel 10, taken along the line II-II' of FIG. 1B, according to an embodiment. Though FIG. 2 shows a cross-section of the electronic apparatus 1, taken along the line II-II' of FIG. 1B, the electronic apparatus 1 shown in FIG. 1A may also have substantially the same structure shown in FIG. 2.

Referring to FIG. 2, the electronic apparatus 1 may include the display panel and a component 70 arranged in the transmissive area TA of the display panel 10. The display panel 10 and the component 70 may be received (e.g., housed) in a housing HS.

The display panel 10 may include a substrate 100, a display layer 200, an input sensing layer 400, an optical functional layer 500, and a cover window 600.

The display layer 200 may include light-emitting elements that emit light to display images, and circuit elements electrically connected to the light-emitting elements and including transistors.

The input sensing layer 400 may obtain coordinate information corresponding to an external input, for example, a touch event. The input sensing layer 400 may include a sensing electrode (or a touch electrode) and trace lines connected to the sensing electrode. The input sensing layer 400 may be disposed on the display layer 200. The input sensing layer 400 may sense an external input by utilizing a self-capacitance method and/or a mutual capacitance method.

The input sensing layer 400 may be directly formed on the display layer 200, or separately formed and then coupled to the display layer 200 by utilizing an optically clear adhesive. In an embodiment, as an example, the input sensing layer 400 may be successively formed after a process of forming the display layer 200. In this case, an adhesive layer may not be disposed between the input sensing layer 400 and the display layer 200. Though it is shown in FIG. 2 that the input sensing layer 400 is disposed between the display layer 200 and the optical functional layer 500, in an embodiment, the input sensing layer 400 may be disposed on the optical functional layer 500.

The optical functional layer 500 may include an anti-reflection layer. The anti-reflection layer may reduce the reflectivity of light (external light) incident toward the display panel 10 from the outside through the cover window 600. The anti-reflection layer may include a retarder and a polarizer.

In another embodiment, the anti-reflection layer may include a black matrix and color filters. The color filters may be arranged by taking into account colors of lights emitted respectively from the light-emitting diodes of the display layer 200. In another embodiment, the anti-reflection layer may include a destructive interference structure. The destructive interference structure may include a first reflection layer and a second reflection layer respectively arranged on different layers. First-reflected light and second-reflected light reflected respectively by the first reflection layer and the second reflection layer may destructively interfere and thus the reflectivity of external light may be reduced.

The optical functional layer 500 may include a lens layer. The lens layer may improve a light output efficiency of light emitted from the display layer 200 and/or reduce color deviation. The lens layer may include a layer having a lens shape that is concave or convex, and/or a plurality of layers having different refractive indexes. The optical functional layer 500 may include both the anti-reflection layer and the lens layer described above, or one of the anti-reflection layer or the lens layer.

The display panel 10 may include an opening 10H. With regard to this, it is shown in FIG. 2 that the substrate 100, the display layer 200, the input sensing layer 400, and the optical functional layer 500 each respectively include (a corresponding one of) first to fourth openings 100H, 200H, 400H, and 500H, and the first to fourth openings 100H, 200H, 400H, and 500H overlap one another.

The first opening 100H may be a through hole passing (e.g., penetrating) through from the upper surface to the bottom surface of the substrate 100. The second opening 200H may be a through hole passing (e.g., penetrating) through from the upper surface to the bottom surface of the display layer 200, the third opening 400H may be a through hole passing (e.g., penetrating) through from the upper surface to the bottom surface of the input sensing layer 400, and the fourth opening 500H may be a through hole passing (e.g., penetrating) through from the upper surface to the bottom surface of the optical functional layer 500. The first to fourth openings 100H, 200H, 400H, and 500H may be located in the transmissive area TA to overlap one another. The first to fourth openings 100H, 200H, 400H, and 500H may be equal to or different from one another in size (or diameter).

In another embodiment, at least one of the substrate 100, the display layer 200, the input sensing layer 400, or the optical functional layer 500 may not include an (e.g., any) opening. In an embodiment, as an example, one, two, or three elements from among the substrate 100, the display layer 200, the input sensing layer 400, and the optical functional layer 500 may not include an (e.g., any) opening.

The cover window 600 may be disposed on the optical functional layer 500. The cover window 600 may be coupled to the optical functional layer 500 by an adhesive layer such as a transparent optically clear adhesive (OCA). The cover window 600 may include glass and/or plastic. The plastic may include polyethersulfone, polyacrylate, polyetherimide, polyethylene naphthalate, polyethylene terephthalate, polyphenylene sulfide, polyarylate, polyimide, polycarbonate, and/or cellulose acetate propionate.

The cover window 600 may include a flexible window. In an embodiment, as an example, the cover window 600 may include a polyimide window or an ultra-thin glass window.

The transmissive area TA may be a component area (e.g., a sensor region, a camera region, a speaker region, and/or the like) in which a component 70 for adding various suitable functions to the electronic apparatus 1 is located. The component 70 may overlap the opening 10H of the display panel 10.

The component 70 may include an electronic element. In an embodiment, as an example, the component 70 may be an electronic element that utilizes light and/or sound. In an embodiment, as an example, the electronic element may include a sensor such as an infrared sensor that utilizes light, a camera that receives light to capture an image, a sensor that outputs and senses light and/or sound to measure a distance and/or recognize a fingerprint, a small lamp that outputs light, and/or a speaker that outputs sound. The electronic element that utilizes light may utilize light in various suitable wavelength bands, such as visible light, infrared light, ultraviolet light and/or the like. Light and/or sound output from the component 70 to the outside or progressing toward the component 70 from the outside may move through the transmissive area TA.

In another embodiment, in the case where the electronic apparatus 1 is utilized as a smartwatch or an instrument panel for an automobile, the component 70 may be a member such as clock hands or a needle indicating set or predetermined information (e.g., the velocity of a vehicle, and/or the like). In this case, unlike what is shown in FIG. 2, the cover window 600 may include an opening located in the transmissive area TA such that the component 70 such as a needle is exposed to the outside. In another embodiment, even in the case where the electronic apparatus 1 includes the component 70 such as a speaker, the cover window 600 may include an opening corresponding to the transmissive area TA.

FIG. 3A is a schematic plan view of the display panel 10 according to an embodiment, and FIG. 3B is a schematic side view of the display panel 10 of FIG. 3A.

Referring to FIG. 3A, the display panel 10 may include the display area DA, the transmissive area TA, the first non-display area NDA1, and the second non-display area NDA2.

The display area DA is a region configured to display images, and may include various suitable shapes, for example, circular shapes, elliptical shapes, polygons, specific figures, and/or the like. Though it is shown in FIG. 1 that the display area DA has an approximately (or substantially) quadrangular shape, the display area DA may have an approximately (or substantially) quadrangular shape having round edges in another embodiment.

The display panel 10 may include light-emitting diodes LED as light-emitting elements arranged in the display area DA, and may be configured to display images by utilizing lights emitted from the light-emitting diodes LED, for example, red, green, and/or blue lights. The light-emitting diode LED may include an organic light-emitting diode including an organic emission layer. In an embodiment, the light-emitting diode LED may be an inorganic light-emitting diode including an inorganic material. The inorganic light-emitting diode may include a PN junction diode including inorganic semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers (e.g., in nano- or micro-meter scale). An emission layer of the light-emitting diode LED may include the organic material or inorganic material. In another embodiment, the emission layer of the light-emitting diode LED may include quantum dots. In other words, the light-emitting diode LED may be a quantum-dot light-emitting diode.

The light-emitting diode LED may be electrically connected to a sub-pixel circuit PC including transistors and may be turned on/off. With regard to this, FIG. 3A shows a scan line SL and a data line DL as signal lines electrically connected to the sub-pixel circuit PC. The sub-pixel circuits PC may be arranged in the display area DA.

The transmissive area TA may be arranged inside the display area DA and may be surrounded by the display area DA entirely. The transmissive area TA may be arranged on the upper center of the display area DA as shown in FIG. 3A. In another embodiment, the transmissive area TA may be arranged on the upper left side of the display area DA, or the upper right side of the display area DA. However, the transmissive area TA may be arranged on various suitable positions.

The first non-display area NDA1 is a non-display area in which the light-emitting didoes LED are not arranged, and may be located between the transmissive area TA and the display area DA. The first non-display area NDA1 may be around (e.g., surround) the transmissive area TA entirely. Signal lines may pass across the first non-display area NDA1, wherein the signal lines are configured to provide signals to the sub-pixel circuits PC provided around (e.g., adjacent to) the transmissive area TA. In an embodiment, as an example, the data line DL and/or the scan line SL may cross the display area DA in a y direction and/or an x direction. Portions of the data line DL and/or the scan line SL may detour (e.g., deviate from a straight line shape) around the first non-display area NDA1 along the opening 10H (or the transmissive area TA) of the display panel 10 formed in the transmissive area TA. In an embodiment, as shown in FIG. 3A, the data line DL detours around the transmissive area TA.

The first non-display area NDA1 may include a structure for preventing or substantially preventing moisture from penetrating (e.g., progressing) into the display area DA. In the case where the display panel 10 includes the opening 10H located in the transmissive area TA, a structure for preventing or substantially preventing moisture that may be introduced through the opening 10H from progressing to the display area DA may be arranged in the first non-display area NDA1. In an embodiment, as an example, a layer (e.g., first and second functional layers described below) including an organic material may be continuously formed in the display area DA to cover the display area DA entirely, but discontinuously formed in the first non-display area NDA1. In an embodiment, as an example, a layer (e.g., the first and second functional layers described below) including an organic material may include a plurality of portions arranged in the first non-display area NDA1 and separated from each other.

The second non-display area NDA2 may be arranged outside the display area DA. The second non-display area NDA2 may be around (e.g., surround) the display area DA entirely. A portion (hereinafter referred to as a protrusion peripheral area) of the second non-display area NDA2 may extend in a direction away from the display area DA. In other words, the display panel 10 may include a main region MR and a sub region SR extending in one direction from the main region MR, wherein the main region MR includes the transmissive area TA, the first non-display area NDA1, the display area DA, and a portion of the second non-display area NDA2 around (e.g., surrounding) the display area DA. The sub region SR may correspond to the protrusion peripheral area. The width (the width in the x direction) of the sub region SR may be less than the width (the width in the x direction) of the main region MR. A portion of the sub region SR may bend as shown in FIG. 3B. In the case where the display panel 10 bends as shown in FIG. 3B, the second non-display area NDA2, which is the non-display area, may not be viewed (e.g., seen), or the area that is viewed (e.g., seen) may be reduced even though the second non-display area NDA2 is viewed (e.g., seen) when the electronic apparatus 1 (see FIG. 1) including the display panel 10 is viewed (e.g., by a viewer).

The shape of the display panel 10 may be substantially the same as that of the substrate 100. In an embodiment, as an example, the substrate 100 may include the transmissive area TA, the first non-display area NDA1, the display area DA, and the second non-display area NDA2. Alternatively, in another embodiment, the substrate 100 may include the main region MR and the sub region SR.

A first driving circuit 2101, a second driving circuit 2102, a data driving circuit 2200, a driving voltage supply line 3000, and a common voltage supply line 4000 may be arranged in the second non-display area NDA2, wherein the first driving circuit 2101 and the second driving circuit 2102 are configured to provide scan signals to each sub-pixel circuit PC, the data driving circuit 2200 is configured to provide data signals to each sub-pixel circuit PC, the driving voltage supply line 3000 is configured to provide a first power voltage ELVDD (see FIG. 4), and the common voltage supply line 4000 is configured to provide a second power voltage ELVSS (see FIG. 4).

The first driving circuit 2101 may be located opposite to the second driving circuit 2102 with the display area DA therebetween. A scan line SL on the left of the transmissive area TA may be electrically connected to the first driving circuit 2101, and a scan line SL on the right of the transmissive area TA may be electrically connected to the second driving circuit 2102.

The data driving circuit 2200 may be configured to transfer data signals to the sub-pixel circuit PC through the data line DL passing across the display area DA. The driving voltage supply line 3000 may be arranged on one side of the display area DA, and the common voltage supply line 4000 may be partially around (e.g., partially surround) the display area DA.

A first terminal part TD1 may be located on one side of the substrate 100. A printed circuit board 5000 may be attached to the first terminal part TD1. The printed circuit board 5000 may include a second terminal part TD2 electrically connected to the first terminal part TD1. A controller 6000 may be disposed on the printed circuit board 5000. Control signals of the controller 6000 may be provided to each of the first and second driving circuits 2101 and 2102, the data driving circuit 2200, the driving voltage supply line 3000, and the common voltage supply line 4000 through the first and second terminal parts TD1 and TD2.

Though it is shown in FIG. 3A that the data driving circuit 2200 is disposed on the substrate 100, the data driving circuit 2200 may be disposed on a printed circuit board electrically connected to a pad arranged on one side of the display panel 10 in another embodiment. The printed circuit board may be flexible, and a portion of the printed circuit board may bend to be located below the backside of the substrate 100.

FIG. 4A is a diagram of an equivalent circuit connected to a light-emitting diode of the display panel 10 according to an embodiment. As described above with reference to FIG. 3, the emission layer of the light-emitting diode may include an organic material, an inorganic material, and/or quantum dots. In an embodiment, FIG. 4A describes the case where the light-emitting diode is an organic light-emitting diode OLED. Thought it is shown in FIG. 4A that the light-emitting diode includes an organic light-emitting diode OLED, the display panel 10 may include the inorganic light-emitting diode or the quantum-dot light-emitting diode instead of the organic light-emitting diode OLED in another embodiment.

The organic light-emitting diode OLED may be electrically connected to the sub-pixel circuit PC. Referring to FIG. 4A, the sub-pixel circuit PC may include first to seventh transistors T1, T2, T3, T4, T5, T6, and T7, a storage capacitor Cst, and a boost capacitor Cbt. In an embodiment, the sub-pixel circuit PC may not include the boost capacitor Cst. Hereinafter, for convenience of description, the case where the sub-pixel circuit PC includes the boost capacitor Cbt is described.

Some of the transistors from among T1, T2, T3, T4, T5, T6, and T7 may be n-channel metal oxide semiconductor (NMOS) field-effect transistors (n-channel MOSFET), and the rest may be p-channel metal oxide semiconductor (PMOS) field-effect transistors (p-channel MOSFET). In an embodiment, as an example, the third and fourth transistors T3 and T4 may both be n-channel MOSFETs, and the rest may all be p-channel MOSFETs. In another embodiment, the third, fourth, and seventh transistors T3, T4, and T7 may all be n-channel MOSFETs, and the rest may all be p-channel MOSFETs. Alternatively, in an embodiment, only one transistor from among the first to seventh transistors T1, T2, T3, T4, T5, T6, and T7 may be an n-channel MOSFET, and the rest may all be p-channel MOSFETs.

The first to seventh transistors T1, T2, T3, T4, T5, T6, and T7, the storage capacitor Cst, and the boost capacitor Cbt may be connected to signal lines. Signal lines may include a first scan line SL1 configured to transfer a first scan signal Sn, a second scan line SL2 configured to transfer a second scan signal Sn', a previous scan line SLp configured to transfer a previous scan signal Sn−1, an emission control line 133 configured to transfer an emission control signal En, a next scan line SLn configured to transfer a next scan signal Sn+1, and a data line 171 crossing the first scan line SL1 and configured to transfer a data signal Dm.

A driving voltage line 175 is configured to transfer the driving voltage ELVDD to the first transistor T1, and first and second initialization voltage lines 145 and 165 may be configured to transfer an initialization voltage Vint that performs initialization.

The first transistor T1 may be a driving transistor. A first gate electrode (or a first control electrode) of the first transistor T1 may be connected to the storage capacitor Cst, a first electrode of the driving transistor T1 may be electrically connected to the driving voltage line 175 through the fifth transistor T5, and a second electrode of the first transistor T1 may be electrically connected to a pixel electrode of the organic light-emitting diode OLED through the sixth transistor T6. One of the first electrode or the second electrode of the first transistor T1 may be a source electrode, and the other one may be a drain electrode. The first transistor T1 may receive a data signal Dm according to a switching operation of the second transistor T2 and be configured to supply a driving current Id to the organic light-emitting diode OLED.

The second transistor T2 may be a switching transistor. A second gate electrode (or a second control electrode) of the second transistor T2 is connected to the first scan line SL1, a first electrode of the second transistor T2 is connected to the data line 171, and a second electrode of the second transistor T2 is connected to the driving first electrode of the first transistor T1 and electrically connected to the driving voltage line 175 through the fifth transistor T5. One of the first electrode or the second electrode of the second transistor T2 may be a source electrode, and the other one may be a drain electrode. The second transistor T2 may be turned on according to a first scan signal Sn transferred through the first scan line SL and may perform a switching operation of transferring a data signal Dm to the first electrode of the first transistor T1, wherein the data signal Dm is transferred through the data line 171.

The third transistor T3 may be a compensation transistor configured to compensate for a threshold voltage of the first transistor T1. A third gate electrode (or a compensation control electrode) of the third transistor T3 is connected to the second scan line SL2. A first electrode of the third transistor T3 is connected to a lower electrode CE1 of the storage capacitor Cst through a node connection line 166, and connected to the first gate electrode of the first transistor T1. A first electrode of the third transistor T3 may be connected to the fourth transistor T4. A second electrode of the third transistor T3 is connected to the second electrode of the first transistor T1 and electrically connected to the pixel electrode of the organic light-emitting diode OLED through the sixth transistor T6. One of the first electrode or the second electrode of the third transistor T3 may be a source electrode, and the other one may be a drain electrode.

The third transistor T3 may be turned on according to a second scan signal Sn transferred through the second scan line SL2, and may diode-connect the first transistor T1 by electrically connecting the first gate electrode to the second electrode of the first transistor T1.

The fourth transistor T4 may be a first initialization transistor configured to initialize the first gate electrode of the first transistor T1. A fourth gate electrode (or a fourth control electrode) of the fourth transistor T4 is connected to the previous scan line SLp. A first electrode of the fourth transistor T4 is connected to a first initialization voltage line 145. A second electrode of the fourth transistor T4 may be connected to the lower electrode CE1 of the storage capacitor Cst, the first electrode of the third transistor T3, and the first gate electrode of the first transistor T1. One of the first electrode or the second electrode of the fourth transistor T4 may be a source electrode, and the other one may be a drain electrode. The fourth transistor T4 may be turned on according to a previous scan signal Sn−1 received through the previous scan line SLp and may perform an initialization operation of initializing the voltage of the first gate electrode of the first transistor T1 by transferring an initialization voltage Vint to the first gate electrode of the driving transistor T1.

The fifth transistor T5 may be an operation control transistor. A fifth gate electrode (or a fifth control electrode) of the fifth transistor T5 is connected to the emission control line 133, a first electrode of the fifth transistor T5 is connected to the driving voltage line 175, and a second electrode of the fifth transistor T5 is connected to the first electrode of the first transistor T1 and the second electrode of the second transistor T2. One of the first electrode or the second electrode of the fifth transistor T5 may be a source electrode, and the other one may be a drain electrode.

The sixth transistor T6 may be an emission control transistor. A sixth gate electrode (or a sixth control electrode) of the sixth transistor T6 is connected to the emission control line 133, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the pixel electrode of the organic light-emitting diode OLED. One of the first electrode or the second electrode of the sixth transistor T6 may be a source electrode, and the other one may be a drain electrode.

The fifth transistor T5 and the sixth transistor T6 may be concurrently (e.g., simultaneously) turned on according to an emission control signal En transferred through the emission control line 133, the driving voltage ELVDD is transferred to the organic light-emitting diode OLED, and the driving current Id flows through the organic light-emitting diode OLED.

The seventh transistor T7 may be a second initialization transistor configured to initialize the pixel electrode of the organic light-emitting diode OLED. A seventh gate electrode (or a seventh control electrode) of the seventh transistor T7 is connected to the next scan line SLn. A first electrode of the seventh transistor T7 is connected to a second initialization voltage line 165. The second electrode of the seventh transistor T7 is connected to the second electrode of the sixth transistor T6 and the pixel electrode of the organic light-emitting diode OLED. The seventh transistor T7 may be turned on according to a next scan signal Sn+1 transferred through the next scan line SLn and may initialize the pixel electrode of the organic light-emitting diode OLED. Though it is shown in FIG. 4A that the seventh transistor T7 is connected to the next scan line SLn, the seventh transistor T7 may be connected to the emission control line 133, and thus driven according to an emission control signal En.

The storage capacitor Cst may include the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line 175. The storage capacitor Cst may be configured to store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the first scan line SL1, and the fourth electrode CE4 may be connected to the first electrode of the third transistor T3 and the node connection line 166. The boost capacitor Cbt may raise the voltage of a first node N1 when a first scan signal Sn supplied to the first scan line SL1 is a turned off signal (e.g., to turn off the organic light-emitting diode OLED). When the voltage of the first node N1 is raised, a black grayscale may be clearly or suitably expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

In an embodiment, it is shown in FIG. 4A that the third and fourth transistors T3 and T4 are both n-channel MOSFETs, and the first, second, fifth to seventh transistors T1, T2, T5, T6, and T7 are all p-channel MOSFETs. The first transistor T1 directly influencing the brightness of the display apparatus may be configured to include a semiconductor layer including polycrystalline silicon having high reliability, and thus, a high-resolution display apparatus may be implemented through this configuration.

FIG. 4B is a diagram of an equivalent circuit connected to a light-emitting diode of the display panel according to another embodiment. Though it is shown in FIG. 4A that the third and fourth transistors T3 and T4 are both n-channel MOSFETs, and the first, second, fifth to seventh transistors T1, T2, T5, T6, and T7 are all p-channel MOSFETs, the embodiment is not limited thereto. In another embodiment, as shown in FIG. 4B, all of the first to seventh transistors T1, T2, T3, T4, T5, T6, and T7 may be p-channel MOSFET, and the boost capacitor may be omitted.

As shown in FIG. 4B, both the second transistor T2 and the third transistor T3 may be connected to the same scan line, for example, the first scan line SL1. The other elements are the same as those described above with reference to FIG. 4A.

FIG. 5 is a plan view of a portion of the display panel according to an embodiment.

Referring to FIG. 5, sub-pixels P may be arranged in the display area DA, and the first non-display area NDA1 may be located between the transmissive area TA and the display area DA.

The sub-pixels P adjacent to the transmissive area TA may be spaced apart from each other around the transmissive area TA in a plan view. The sub-pixels P may be vertically apart from each other around the transmissive area TA, and/or horizontally apart from each other around the transmissive area TA. The sub-pixel P is a minimum area from which light is emitted, and is a region from which red, green, or blue light is emitted. Light of the sub-pixel P is implemented (e.g., provided) by the light-emitting diode described above with reference to FIG. 3. The positions of the sub-pixels P respectively correspond to the positions of the light-emitting diodes. Accordingly, when the sub-pixels P are apart from each other around the transmissive area TA in a plan view, it may represent the light-emitting diodes are apart from each other around the transmissive area TA in a plan view. In an embodiment, as an example, in a plan view, the light-emitting diodes may be vertically apart from each other around the transmissive area TA, and/or horizontally apart from each other around the transmissive area TA.

From among signal lines configured to supply signals to a sub-pixel circuit electrically connected to a light-emitting diode of each sub-pixel P, signal lines adjacent to the transmissive area TA may detour (e.g., curve) around the transmissive area TA and/or the opening 10H. Some of data lines DL passing across the display area DA may extend in ±y directions (e.g., as a straight line) to provide data signals to sub-pixels P vertically arranged with the transmissive area TA therebetween, and detour (e.g., curve) along the edge of the transmissive area TA and/or the opening 10H in the first non-display area NDA1. Some of scan lines SL passing across the display area DA may be horizontally arranged with the transmissive area TA therebetween, and spaced apart from each other. In an embodiment, as an example, a left scan line SL and a right scan line SL may be arranged on the same row, separated and apart from each other with the transmissive area TA therebetween.

At least one partition wall may be located in the first non-display area NDA1, wherein the at least one partition wall may be more adjacent (e.g., closer) to the transmissive area TA than a detouring portion DL-C of the data lines DL. With regard to this, FIG. 5 shows first to third partition walls PW1, PW2, and PW3. The first to third partition walls PW1, PW2, and PW3 may each have a closed loop shape around (e.g., surrounding) the transmissive area TA and/or the opening 10H, and may be spaced apart from each other in the first non-display area NDA1.

A recess portion RC may be arranged in the first non-display area NDA1, wherein the recess portion RC is located between the detouring portion DL-C of the data lines DL and the at least one partition wall. The recess portion RC may correspond to a recess formed by removing a portion of a multi-layer insulating layer (e.g., a multi-layer inorganic insulating layer) arranged in the display panel 10. As shown in FIG. 5, the recess portion RC may have a closed loop shape around (e.g., surrounding) the transmissive area TA and/or the opening 10H in a plan view.

FIG. 6 is a schematic cross-sectional view of a display panel, taken along the line VI-VI' of FIG. 5, according to an embodiment, FIG. 7 is a plan view of at least one organic material layer shown in FIG. 6, FIG. 8 is a plan view of the second electrode shown in FIG. 6, and FIG. 9 is a cross-sectional view of a region IX of FIG. 6. For convenience of description, FIG. 6 omits the optical functional layer 50 (see FIG. 2) and the cover window 60 (see FIG. 2) in the display panel 10 described above with reference to FIG. 2.

Referring to FIG. 6, the display panel 10 may include the opening 10H arranged in the transmissive area TA. The opening 10H may have a through hole shape passing (e.g., penetrating) through the upper surface and the lower surface of the display panel 10.

When the display panel 10 includes the opening 10H arranged in the transmissive area TA, it may represent that the plurality of layers included in the display panel 10 also include openings arranged in the transmissive area TA. The substrate 100 may include the first opening 100H arranged in the transmissive area TA. The first opening 100H of the substrate 100 has a through hole shape passing (e.g., penetrating) through the upper surface and the lower surface of the substrate 100.

In the display area DA of FIG. 6, the sub-pixel circuit PC may be disposed over the substrate 100, and the organic light-emitting diode OLED may be disposed on the sub-pixel circuit PC. FIG. 6 shows the sub-pixel circuit PC and the organic light-emitting diode OLED closest to the transmissive area TA. The structures of the sub-pixel circuit PC and the organic light-emitting diode OLED shown in FIG. 6 are the same as the structures of another sub-pixel circuit PC and another organic light-emitting diode OLED disposed away from the transmissive area TA.

The substrate 100 may include glass and/or a polymer resin. In an embodiment, as an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, and/or the like. The substrate 100 including the polymer resin may be flexible, rollable, and/or bendable. In an embodiment, the substrate 100 may have a multi-layered structure including a layer that includes the polymer resin and an inorganic layer.

A buffer layer 201 may be disposed on the upper surface of the substrate 100. The buffer layer 201 may prevent or substantially prevent impurities from penetrating into a semiconductor layer of a transistor. The buffer layer 201 may include an inorganic insulating material such as silicon nitride, silicon oxynitride, and/or silicon oxide, and may include a single layer or a multi-layer including the above inorganic insulating materials.

The sub-pixel circuit PC may be disposed on the buffer layer 201. As described above with reference to FIG. 4A, the sub-pixel circuit PC may include the plurality of transistors and the storage capacitor. With regard to this, FIG. 6 shows the first transistor T1, the third transistor T3, and the storage capacitor Cst.

The first transistor T1 may include the semiconductor layer (referred to as a first semiconductor layer A1) on the buffer layer 201, and a gate electrode (referred to as a first gate electrode GE1) overlapping a channel region Cl of the first semiconductor layer A1. The first semiconductor layer A1 may include a silicon-based semiconductor material, for example, polycrystalline silicon. The first semiconductor layer A1 may include the channel region Cl, and a first region B1 and a second region D1 respectively arranged on two opposite sides of the channel region Cl. The first region B1 and the second region D1 are regions including impurities of higher concentration than that of the channel region Cl. One of the first region B1 or the second region D1 may correspond to a source region, and the other one may correspond to a drain region.

A first gate insulating layer 203 may be arranged between the first semiconductor layer A1 and the first gate electrode GE1. The first gate insulating layer 203 may include an inorganic insulating material such as silicon nitride, silicon oxynitride, and/or silicon oxide, and may include a single-layered structure or a multi-layered structure including the above inorganic insulating materials.

The first gate electrode GE1 may include a conductive material including molybdenum (Mo), aluminum (Al), copper (Cu), and/or titanium (Ti), and may have a single-layered structure or a multi-layered structure including the above materials.

The storage capacitor Cst may include the lower electrode CE1 and the upper electrode CE2 overlapping each other. In an embodiment, the lower electrode CE1 of the storage capacitor Cst may include the first gate electrode GE1. In other words, the first gate electrode GE1 may include the lower electrode CE1 of the storage capacitor Cst. In an embodiment, as an example, the first gate electrode GE1 and the lower electrode CE1 of the storage capacitor Cst may be formed as one body.

A first interlayer insulating layer 205 may be disposed between the lower electrode CE1 and the upper electrode CE2 of the storage capacitor Cst. The first interlayer insulating layer 205 may include an inorganic insulating material such as silicon nitride, silicon oxynitride, and/or silicon oxide, and may include a single-layered structure or a multi-layered structure including the above inorganic insulating materials.

The upper electrode CE2 of the storage capacitor Cst may include a conductive low-resistance material such as molybdenum (Mo), aluminum (Al), copper (Cu) and/or titanium (Ti), and may have a single-layered structure or a multi-layered structure including the above materials.

A second interlayer insulating layer 207 may be disposed on the storage capacitor Cst. The second interlayer insulating layer 207 may include an inorganic insulating material such as silicon nitride, silicon oxynitride, and/or silicon oxide, and may include a single-layered structure or a multi-layered structure including the above inorganic insulating materials.

A semiconductor layer (referred to as a third semiconductor layer A3) of the third transistor T3 may be disposed on the second interlayer insulating layer 207. The third semiconductor layer A3 may include an oxide-based semiconductor material. In an embodiment, as an example, the third semiconductor layer A3 may include a Zn-oxide-based material, for example, Zn-oxide, In—Zn oxide, and/or Ga—In—Zn oxide. In an embodiment, the third semiconductor layer A3 may include a semiconductor containing a metal such as indium (In), gallium (Ga), and/or tin (Sn) in ZnO, such as In—Ga—Zn—O (IGZO), In—Sn—Zn—O (ITZO), and/or In—Ga—Sn—Zn—O (IGTZO).

The third semiconductor layer A3 may include a channel region C3, and a first region B3 and a second region D3 respectively arranged on two opposite sides of the channel region C3. One of the first region B3 or the second region D3 may correspond to a source region, and the other one may correspond to a drain region.

The third transistor T3 may include a gate electrode (referred to as a third gate electrode GE3, hereinafter) overlapping the channel region C3 of the third semiconductor layer A3. The third gate electrode GE3 may have a double gate structure including a lower gate electrode G3A and an upper gate electrode G3B, wherein the lower gate electrode G3A is below the third semiconductor layer A3, and the upper gate electrode G3B is over (e.g., above) the channel region C3.

The lower gate electrode G3A may be on the same layer (e.g., the first interlayer insulating layer 205) as a layer on which the upper electrode CE2 of the storage capacitor Cst is arranged. The lower gate electrode G3A may include the same material as that of the upper electrode CE2 of the storage capacitor Cst.

The upper gate electrode G3B may be disposed over the third semiconductor layer A3 with a second gate insulating layer 209 therebetween. The second gate insulating layer 209 may include an inorganic insulating material such as silicon nitride, silicon oxynitride, and/or silicon oxide, and may include a single-layered structure or a multi-layered structure including the above inorganic insulating materials.

A third interlayer insulating layer 210 may be disposed on the upper gate electrode G3B. The third interlayer insulating layer 210 may include an inorganic insulating material such as silicon oxynitride, and may have a single layer or a multi-layer including the inorganic insulating materials.

Though it is shown in FIG. 6 that the upper electrode CE2 of the storage capacitor Cst is arranged on the same layer as the lower gate electrode G3A of the third gate electrode GE3, the embodiment is not limited thereto. In another embodiment, the upper electrode CE2 of the storage capacitor Cst may be arranged on the same layer as the third semiconductor layer A3, and may include the same material as that of the first region B3 and the second region D3 of the third semiconductor layer A3.

The first transistor T1 may be electrically connected to the third transistor T3 through the node connection line 166. The node connection line 166 may be disposed on the third interlayer insulating layer 210. One side of the node connection line 166 may be connected to the first gate electrode GE1 of the first transistor T1, and another side of the node connection line 166 may be connected to the first region B3 of the third semiconductor layer A3 of the third transistor T3.

The node connection line 166 may include aluminum (Al), copper (Cu), and/or titanium (Ti), and may include a single layer or a multi-layer including the above materials. In an embodiment, as an example, the node connection line 166 may have a triple-layered structure of titanium layer/aluminum layer/titanium layer.

A first organic insulating layer 211 may be disposed on the node connection line 166. The first organic insulating layer 211 may include an organic insulating material. The organic insulating material may include acryl, benzocyclobutene (BCB), polyimide, and/or hexamethyldisiloxane (HMDSO).

The data line DL and a driving voltage line PL may be disposed on the first organic insulating layer 211 and covered by a second organic insulating layer 213. The data line DL and the driving voltage line PL may include aluminum (Al), copper (Cu), and/or titanium (Ti), and may include a single layer or a multi-layer including the above materials. In an embodiment, as an example, the data line DL and the driving voltage line PL may each have a triple-layered structure of titanium layer/aluminum layer/titanium layer.

The second organic insulating layer 213 may include acryl, BCB, polyimide, and/or HMDSO. Though it is shown in FIG. 6 that the data line DL and the driving voltage line PL are disposed on the first organic insulating layer 211, the embodiment is not limited thereto. In another embodiment, one of the data line DL or the driving voltage line PL may be disposed on the same layer (e.g., the third interlayer insulating layer 210) as a layer on which the node connection line 166 is disposed.

A first electrode 221 of the organic light-emitting diode OLED may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. In another embodiment, the first electrode 221 may further include a conductive oxide material layer on and/or under the reflective layer. The conductive oxide material layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the first electrode 221 may have a triple-layered structure of ITO layer/Ag layer/ITO layer.

A bank layer 215 may be disposed on the first electrode 221. The bank layer 215 may include an opening that overlaps the first electrode 221 and cover the edges of the first electrode 221. The bank layer 215 may include an organic insulating material such as polyimide.

A spacer 217 may be formed on the bank layer 215. The spacer 217 may be formed together during the same process as a process of forming the bank layer 215, or formed separately during a separate process. In an embodiment, the spacer 217 may include an organic insulating material such as polyimide. Alternatively, in an embodiment, the bank layer 215 may include an organic insulating material including a light-blocking dye, and the spacer 217 may include an organic insulating material such as polyimide.

An intermediate layer 222 includes an emission layer 222*b*. The intermediate layer 222 may include a first functional layer 222*a* and/or a second functional layer 222*c*, wherein the first functional layer 222*a* is under the emission layer 222*b*, and the second functional layer 222*c* is on the emission layer 222*b*. The emission layer 222*b* may include a polymer organic material or a low-molecular weight organic material emitting light having a preset color. The second functional layer 222*c* may include an electron transport layer (ETL) and/or an electron injection layer (EIL). The first functional layer 222*a* and the second functional layer 222*c* may each include an organic material.

The second electrode 223 may include a conductive material having a low work function. In an embodiment, as an example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), and/or an alloy thereof. Alternatively, in an embodiment, the second electrode 223 may further include a layer on the (semi) transparent layer, the layer including ITO, IZO, ZnO, and/or $In_2O_3$.

The emission layer 222*b* may be formed in the display area DA to overlap the first electrode 221 through the opening of the bank layer 215. In contrast, an organic material layer, for example, the first functional layer 222*a* and the second functional layer 222*c* included in the intermediate layer, may cover the display area DA entirely. The second electrode 223 may cover the display area DA entirely.

The capping layer 225 may be disposed on the second electrode 223. The capping layer 225 may include an inorganic material and/or an organic material. The capping layer 225 may include lithium fluoride (LiF), an inorganic insulating material and/or an organic insulating material. The capping layer 225 may cover the display area DA entirely.

The organic light-emitting diode OLED including the first electrode 221, the intermediate layer 222, and the second electrode 223 may be covered by an encapsulation layer 300. The encapsulation layer 300 may include at least one organic encapsulation layer and at least one inorganic encapsulation layer. In an embodiment, it is shown in FIG. 6 that the encapsulation layer 300 includes first and second inorganic encapsulation layers 310 and 330, and an organic encapsulation layer 320 therebetween. The encapsulation layer 300 may be disposed on the capping layer 225.

The first and second inorganic encapsulation layer 310 and 330 may include at least one inorganic material from among aluminum oxide, titanium oxide, tantalum oxide, hafnium oxide, zinc oxide, silicon oxide, silicon nitride, silicon oxynitride, and/or the like. The first and second inorganic encapsulation layer 310 and 330 may include a single layer or a multi-layer including the above materials. The organic encapsulation layer 320 may include a polymer-based material. The polymer-based material may include an acryl-based resin, an epoxy-based resin, polyimide, and/or polyethylene. In an embodiment, the organic encapsulation layer 320 may include acrylate.

The thickness of the first inorganic encapsulation layer 310 may be different from that of the second inorganic encapsulation layer 330. The thickness of the first inorganic encapsulation layer 310 may be greater than that of the second inorganic encapsulation layer 330. Alternatively, in an embodiment, the thickness of the second inorganic encapsulation layer 330 may be greater than that of the first inorganic encapsulation layer 310, or the thickness of the first inorganic encapsulation layer 310 may be the same as that of the second inorganic encapsulation layer 330.

The input sensing layer 400 may be disposed on the encapsulation layer 300. The input sensing layer 400 may include touch electrodes TE and at least one touch insulating layer arranged in the display area DA. With regard to this, it is shown in FIG. 6 that the input sensing layer 400 includes a first touch insulating layer 410, a first touch conductive layer 420, a second touch insulating layer 430, a second touch conductive layer 440, and a third touch insulating layer 450, wherein the first touch insulating layer 410 and the first touch conductive layer 420 are on the second inorganic encapsulation layer 330, the second touch insulating layer 430 is on the first touch conductive layer 420, the second touch conductive layer 440 is on the second touch insulating layer 430, and the third touch insulating layer 450 is on the second touch conductive layer 440.

The first touch insulating layer 410, the second touch insulating layer 430, and the third touch insulating layer 450 may each include an inorganic insulating material and/or an organic insulating material. In an embodiment, the first touch insulating layer 410 and the second touch insulating layer 430 may each include an inorganic insulating material such as silicon oxide, silicon nitride, and/or silicon oxynitride, and the third touch insulating layer 450 may include an organic insulating material.

The touch electrode TE of the input sensing layer 400 may have a structure in which the first touch conductive layer 420 is connected to the second touch conductive layer 440. Alternatively, in an embodiment, the touch electrode TE may include one of the first touch conductive layer 420 or the second touch conductive layer 440.

Each of the first touch conductive layer 420 and the second touch conductive layer 440 may include aluminum (Al), copper (Cu), and/or titanium (Ti), and may include a single layer or a multi-layer including the above materials. In an embodiment, as an example, each of the first touch conductive layer 420 and the second touch conductive layer 440 may have a triple-layered structure of titanium layer/aluminum layer/titanium layer.

Next, in the first non-display area NDA1 of FIG. 6, the first organic insulating layer 211 and the second organic insulating layer 213 may each extend in the first non-display area NDA1. One edge (e.g., end) of the first organic insulating layer 211 may be arranged in the first non-display area NDA1. With regard to this, it is shown in FIG. 6 that a lateral surface corresponding to one edge of the first organic insulating layer 211 is arranged in the first non-display area NDA1. One edge (e.g., end) of the second organic insulating layer 213 may be arranged in the first non-display area NDA1. With regard to this, it is shown in FIG. 6 that a lateral surface corresponding to one edge of the second organic insulating layer 213 is arranged in the first non-display area NDA1. The second organic insulating layer 213 may cover the lateral surface of the first organic insulating layer 211. One edge of the second organic insulating layer 213 may be arranged closer to the transmissive area TA than one edge of the first organic insulating layer 211. One edge of each of the first organic insulating layer 211 and the second organic insulating layer 213 may be spaced apart from the first partition wall PW1.

The detouring portions DL-C of the data lines may be disposed on different layers with the first organic insulating layer 211 therebetween in the first non-display area NDA1. One of the detouring portions DL-C of adjacent data lines may be disposed on the first organic insulating layer 211, and the other may be disposed under the first organic insulating layer 211. The detouring portions DL-C of the data lines shown in FIG. 6 correspond to portions (curved portions along the transmissive area TA in FIG. 5) arranged in the first non-display area NDA1 from among the data lines DL described above with reference to FIG. 5.

At least one partition wall is arranged in the first non-display area NDA1. Though FIG. 6 shows three partition walls, one, two, four or more partition walls may be provided in another embodiment.

The first partition wall PW1, the second partition wall PW2, and the third partition wall PW3 may be arranged in the first non-display area NDA1, and spaced apart from each other in a direction facing the transmissive area TA from the display area DA. The first partition wall PW1 may be the closest to the display area DA, the third partition wall PW3 may be closer to the transmissive area TA than the first partition wall PW1, and the second partition wall PW2 may be arranged between the first partition wall PW1 and the third partition wall PW3. The first partition wall PW1, the second partition wall PW2, and the third partition wall PW3 may each have a closed-loop shape around (e.g., surrounding) the transmissive area TA and the opening 10H as shown in FIG. 5.

As shown in FIG. 6 and embodiments described below, because the first opening 100H is formed in the substrate 100 to correspond to the opening 10H of the display panel 10, the terms the "transmissive area TA," the "opening 10H of the display panel 10," and the "first opening 100H of the substrate 100" may be used interchangeably in the present specification. As an example, "around (e.g., surround) the opening 10H of the display panel 10" may refer to "around (e.g., surround) the first opening 100H of the substrate 100," and/or "around (e.g., surround) the transmissive area TA."

The first partition wall PW1, the second partition wall PW2, and the third partition wall PW3 may each include an insulating material. In an embodiment, as an example, the first partition wall PW1, the second partition wall PW2, and the third partition wall PW3 may each include an organic insulating material, and may be concurrently (e.g., simultaneously) formed during a process of forming a plurality of insulating material layers arranged in the display area DA.

The heights of the first partition wall PW1, the second partition wall PW2, and the third partition wall PW3 may be equal to or different from each other. It is shown in FIG. 6 that the first partition wall PW1 and the second partition wall PW2 have the same height, and the third partition wall PW3 has a height less than those of the first partition wall PW1 and the second partition wall PW2. In another embodiment, the first partition wall PW1, the second partition wall PW2, and the third partition wall PW3 may all have different heights.

The at least one partition wall, for example, the first partition wall PW1, the second partition wall PW2, and the third partition wall PW3 may be configured to control a flow of the material forming the organic encapsulation layer 320 during a process of forming the encapsulation layer 300. In an embodiment, as an example, the organic encapsulation layer 320 may be formed by coating a monomer in the display area DA by utilizing a process such as an inkjet process and/or the like, and then hardening (e.g., curing or polymerizing) the monomer. The partition wall may be configured to control the position of the organic encapsulation layer 320 by controlling the flow of the monomer. With regard to this, it is shown in FIG. 6 that an edge (e.g., end) 320E of the organic encapsulation layer 320 is located on one side of the first partition wall PW1. In another embodiment, the edge 320E of the organic encapsulation layer 320 is disposed on the upper surface of the first partition wall PW1, and because the edge 320E of the organic encapsulation layer 320 is disposed on the upper surface of the first partition wall PW1, a portion of the organic encapsulation layer 320 may overlap the upper surface of the first partition wall PW1.

In the embodiment the edge 320E of the organic encapsulation layer 320 is located one side of one of the partition walls, for example, the first partition wall PW1, the second inorganic encapsulation layer 330 may directly contact the first inorganic encapsulation layer 310 in the first non-display area NDA1. In an embodiment, as an example, the first and second inorganic encapsulation layers 310 and 330 may directly contact each other in a region between the edge 320E of the organic encapsulation layer 320 and the opening 10H of the display panel 10. In an embodiment, it is shown in FIG. 6 that the first and second inorganic encapsulation layers 310 and 330 directly contact each other in a region between the first partition wall PW1 and the opening 10H of the display panel 10.

The insulating layers of the input sensing layer 400, for example, the first touch insulating layer 410, the second touch insulating layer 430, and the third touch insulating layer 450 may extend to the first non-display area NDA1. The third touch insulating layer 450 including the organic insulating material may be arranged in the first non-display area NDA1, and entirely cover the structure disposed under the third touch insulating layer 450. The third touch insulating layer 450 may have a function as a planarization layer, and thus, the upper surface of the input sensing layer 400 may have a substantially flat surface. In other words, a vertical distance from the upper surface of the substrate 100 to the upper surface of the third touch insulating layer 450 in the display area DA may be substantially the same as a vertical distance from the upper surface of the substrate 100 to the upper surface of the third touch insulating layer 450 in the first non-display area NDA1. Here, the term "substantially the same" may indicate that the error (e.g., difference) is about 30% or less (for example, about 20% or less).

At least one organic material layer 220o included in the intermediate layer 222 may be formed to cover the display area DA entirely. The organic material layer 220o may even be formed in the first non-display area NDA1. The organic material layer 222o may provide a path through which moisture is introduced. Because the organic material layer 222o includes an opening (hereinafter referred to a first opening 222oh) located in the first non-display area NDA1, moisture that may be introduced through the opening 10H may be prevented or reduced from moving to the display area DA through the organic material layer 222o.

As shown in FIG. 6, the first openings 222oh of the organic material layer 222o may be spaced apart from each other in the first non-display area NDA1. With regard to this, FIG. 6 shows a first opening 222oh between the first partition wall PW1 and the recess portion RC, a first opening 222oh between the first partition wall PW1 and the second partition wall PW2, and a first opening 222oh between the second partition wall PW2 and the third partition wall PW3, a first opening 222oh between the third partition wall PW3 and a crack-preventing recess portion GC. In the case where the organic material layer 222o includes the first functional layer 222a and the second functional layer 222c, an opening 222ah of the first functional layer 222a and an opening 222ch of the second functional layer 222c may overlap each other to constitute the first opening 222oh.

The organic material layer 222o may include separation portions 222op spaced apart from each other by the first opening 222*oh* in the first non-display area NDA1. In the case where the organic material layer 222*o* includes the first functional layer 222*a* and the second functional layer 222*c*, the separation portions 222*op* of the organic material layer 222*o* may include a portion (hereinafter referred to as a separation portion 222*ap*) of the first functional layer 222*a*, and a portion (hereinafter referred to as a separation portion 222*cp*) of the second functional layer 222*c*. According to an embodiment of FIG. 6, an overlapping structure of the separation portion 222*ap* of the first functional layer 222*a* and the separation portion 222*cp* of the second functional layer 222*c* may correspond to the separation portion 222*op* of the organic material layer 222*o*.

Some of the first openings 222*oh* may be respectively located between adjacent partition walls. In an embodiment, as an example, as shown in FIG. 6, the first openings 222*oh* may be respectively located between the first partition wall PW1 and the second partition wall PW2, and between the second partition wall PW2 and the third partition wall PW3.

The first opening 222*oh* closest to the display area DA from among the first openings 222*oh* may be located between the recess portion RC and the first partition wall PW1. A portion of the organic material layer 222*o* between the first electrode 221 and the second electrode 223 in the display area DA extends to the first non-display area NDA1 but does not pass across the first partition wall PW1. The edge of a portion of the organic material layer 222*o* extending from the display area DA to the first non-display area NDA1 may be located between the recess portion RC and the first partition wall PW1. In other words, in the cross-sectional view of FIG. 6, a left portion of the first opening 222*oh* closest to the display area DA may correspond to the edge of a portion of the organic material layer 222*o* extending from the display area DA to the first non-display area NDA1. A right portion of the first opening 222*oh* closest to the display area DA may correspond to the edge of the separation portion 222*op* closest to the display area DA.

Referring to FIG. 7, each of the first openings 222*oh* may extend along the edge of the opening 10H, and have a closed-loop shape completely around (e.g., surrounding) the opening 10H in a plan view. Accordingly, the separation portions 222*op* of the organic material layer 222*o* spaced apart from each other by the first opening 222*oh* may also have a closed-loop shape entirely around (e.g., surrounding) the transmissive area TA as shown in FIG. 7. In a cross-sectional view, the separation portions 222*op* of the organic material layer 222*o* may each cover the first partition wall PW1, the second partition wall PW2, and the third partition wall PW3 as shown in FIG. 6.

Referring to FIG. 6 again, the separation portion 222*op* of the organic material layer 222*o* disposed on the partition wall may cover the upper surface and the lateral surface of the partition wall, and both edges may directly connect the inorganic insulating layer under the partition wall. In an embodiment, as an example, the separation portion 222*op* of the organic material layer 222*o* on the first partition wall PW1 may directly contact the upper surface and the lateral surface of the first partition wall PW1, and both edges may directly contact the upper surface of the third interlayer insulating layer 210. Likewise, the separation portion 222*op* of the organic material layer 222*o* on the second partition wall PW2 or the third partition wall PW3 may directly contact the upper surface and the lateral surface of the second partition wall PW2 or the third partition wall PW3, and both edges may directly contact the upper surface of the third interlayer insulating layer 210.

The separation portion 222*op* of the organic material layer 222*o* closest to the transmissive area TA may cover the crack-preventing recess portion GC. To block or protect cracks from occurring and propagating to the display area DA during a process of forming the opening 10H of the display panel 10 and/or other processes of manufacturing the display panel 10, a multi-layer insulating layer MIL between the substrate 100 and the partition wall may include the crack-preventing recess portion GC. The crack-preventing recess portion GC is a recess and may be formed by removing a portion of the multi-layer insulating layer MIL in a depth (e.g., thickness) direction thereof.

The multi-layer insulating layer MIL may include a plurality of inorganic insulating layers, and the term "plurality of inorganic insulating layers" refer to two or more inorganic insulating layers. In an embodiment, the multi-layer insulating layer MIL may include the buffer layer 201, the first gate insulating layer 203, the first interlayer insulating layer 205, the second interlayer insulating layer 207, the second gate insulating layer 209, and the third interlayer insulating layer 210. The crack-preventing recess portion GC may be formed by removing a portion of sub-layers constituting the multi-layer insulating layer MIL. It is shown in FIG. 6 that the crack-preventing recess portion GC is formed by removing a portion of the second interlayer insulating layer 207, a portion of the second gate insulating layer 209, and a portion of the third interlayer insulating layer 210 along the depth direction (or the thickness direction).

It is shown that the second electrode 223 formed to cover the display area DA entirely extends to the first non-display area NDA1, and an edge (e.g., end) 223*ep* of the second electrode 223 is located between the display area DA and the first partition wall PW1. In an embodiment, it is shown in FIG. 6 that the edge 223*ep* of the second electrode 223 is located between the display area DA and the recess portion RC, for example, between the edge (e.g., end or the lateral surface) of the second organic insulating layer 213 and the recess portion RC.

In an embodiment, the edge 223*ep* of the second electrode 223 shown in FIG. 6 is a portion of the second electrode 223 most adjacent to the opening 10H. There may not be a layer corresponding to the second electrode 223 in a region from the edge 223*ep* of the second electrode 223 to the opening 10H. In other words, there may not be a layer having the same material and structure as those of the second electrode 223 between the edge 223*ep* of the second electrode 223 and the opening 10H.

The edge 223*ep* of the second electrode 223 may be located between the display area DA and the recess portion RC. An edge (e.g., end) 225*ep* of the capping layer 225 may be also located between the display area DA and the recess portion RC.

Similar to the second electrode 223, there may not be a layer including the same material and structure as those of the capping layer 225 between the edge 225*ep* of the capping layer 225 and the opening 10H.

The edge 223*ep* of the second electrode 223 and the edge 225*ep* of the capping layer 225 may be covered by the first inorganic encapsulation layer 310, and may overlap the organic encapsulation layer 320. The second electrode 223 may be formed by forming a second electrode material layer that covers the display area DA and the first non-display area NDA1 entirely, and then removing a portion of the second electrode material layer located in the first non-display area NDA1.

While the organic material layer 222*o* includes the plurality of first openings 222*oh*, the second electrode 223 and the capping layer 225 may respectively include a single second opening 223*oh* and a single third opening 225*oh* as shown in FIG. 8. Referring to FIGS. 6, 7, and 8, the single second opening 223*oh* and single third opening 225*oh* may overlap the plurality of first openings 222*oh*. In other words, the first opening 222*oh* and the separation portions 222*op* spaced apart from each other by the first opening 222*oh* may be located inside the single second opening 223*oh* and/or the single third opening 225*oh*.

The first openings 222*oh* of the organic material layer 222*o*, the second opening 223*oh* of the second electrode 223, and the third opening 225*oh* of the capping layer 225 may be removed (e.g., altered) by a laser lift-off process from among the processes of manufacturing the display panel 10. A laser beam in the laser lift-off process may be refracted by structures of the partition wall including various suitable layers formed on the substrate 100, for example, the inorganic insulating layer and the organic insulating material, and may move (e.g., may be refracted) toward the display area DA. As a result, the edge 223*ep* of the second electrode 223 may curl up in a z direction (a direction away from the upper surface of the substrate 100) from the upper surface of the third interlayer insulating layer 210. When the position of the edge 223*ep* of the second electrode 223 is not easily controlled by the laser beam as described above, the edge 223*ep* of the second electrode 223 may pass through the organic encapsulation layer 320, and thus, an encapsulation characteristic of the display panel may be deteriorated and defects may be generated. In contrast, because the recess portion RC is arranged between the display area DA and the partition wall (e.g., the first partition wall PW1), refraction of the laser beam may be prevented or reduced, and thus, the position of the edge 223*ep* of the second electrode 223 may be easily controlled.

The recess portion RC may be formed in the multi-layer insulating layer MIL arranged between the substrate 100 and the partition wall. The recess portion RC may have a closed-loop shape around (e.g., surrounding) the transmissive area TA between the display area DA and the first partition wall PW1 as shown above in FIG. 5. The recess portion RC is a kind of recess and may be formed by removing a portion of the sub-layers constituting the multi-layer insulating layer MIL. In an embodiment, it is shown in FIG. 6 that the recess portion RC is formed by removing a portion of the second interlayer insulating layer 207, a portion of the second gate insulating layer 209, and a portion of the third interlayer insulating layer 210 in the depth direction (or the thickness direction).

Referring to FIG. 9, the second interlayer insulating layer 207 and the third interlayer insulating layer 210 may each include a plurality of layers including different materials. In an embodiment, as an example, the second interlayer insulating layer 207 may include a first sub-layer 207*a* including silicon nitride, and a second sub-layer 207*b* including silicon oxide. The third interlayer insulating layer 210 may include a first sub-layer 210*a* including silicon oxide, and a second sub-layer 210*b* including silicon nitride. In an embodiment, the buffer layer 201, the first gate insulating layer 203, and the second gate insulating layer 209 may all include the same material (e.g., silicon oxide), and the first interlayer insulating layer 205 may include silicon nitride.

The recess portion RC may include a hole 207*h*, a hole 209*h*, and a hole 210*h* overlapping one another, wherein the hole 207*h* passes (e.g., penetrates) through the upper surface and the lower surface of the second interlayer insulating layer 207, the hole 209*h* passes (e.g., penetrates) through the upper surface and the lower surface of the second gate insulating layer 209, and the hole 210*h* passes (e.g., penetrates) through the upper surface and the lower surface of the third interlayer insulating layer 210. The upper width of the recess portion RC may be greater than the lower width of the recess portion RC. The inner surface of the recess portion RC may have a gentle slope. At least one silicon nitride layer may be disposed under the bottom surface of the recess portion RC. With regard to this, it is shown in FIG. 9 that the first interlayer insulating layer 205 including silicon nitride is disposed under the recess portion RC.

Though it is described with reference to FIGS. 6 and 9 that the recess portion RC passes through the second interlayer insulating layer 207, the second gate insulating layer 209, and the third interlayer insulating layer 210, the embodiment is not limited thereto. The recess portion RC may be formed by removing a portion of one or more sub-layers included in the multi-layer insulating layer MIL, and the number of sub-layers are not limited. In an embodiment, as an example, the depth of the recess portion RC may be equal to or less than the thickness of the multi-layer insulating layer MIL.

FIGS. 10A to 10E are cross-sectional view (e.g., taken along the line VI-VI' of FIG. 6) showing a process of manufacturing a display panel according to an embodiment.

Referring to FIG. 10A, the substrate 100 is prepared. Then, the transistors and the storage capacitor Cst are formed over the substrate 100 to be located in the display area DA. With regard to this, it is shown in FIG. 10A that the first and third transistors T1 and T3, and the storage capacitor Cst are formed over the substrate 100. The buffer layer 201 may be formed before the first transistor T1 is formed. A process of forming the first to third transistors T1 and T3 and the storage capacitor Cst may include a process of forming the first and third semiconductor layers A1 and A3 and the electrodes, and a process of forming the insulating layers. The buffer layer 201, the first gate insulating layer 203, the first interlayer insulating layer 205, the second interlayer insulating layer 207, the second gate insulating layer 209, and the third interlayer insulating layer 210 may be formed to cover the display area DA, the first non-display area NDA1, and the transmissive area TA entirely.

To electrically connect the first gate electrode GE1 of the first transistor T1 to the third semiconductor layer A3 of the third transistor T3, the insulating layers on the first gate electrode GE1 of the first transistor T1, and the insulating layers on the third semiconductor layer A3 of the third transistor T3 may include first and second contact holes 210*h*1 and 210*h*2, respectively. The first contact hole 210*h*1 may pass (e.g., penetrate) through the second gate insulating layer 209 and the third interlayer insulating layer 210, and the second contact hole 210*h*2 may pass (e.g., penetrate) through the first interlayer insulating layer 205, the second interlayer insulating layer 207, the second gate insulating layer 209, and the third interlayer insulating layer 210.

The recess portion RC and the crack-preventing recess portion GC may be formed during an etching process of forming the first contact hole 210*h*1. The recess portion RC and the crack-preventing recess portion GC may each be formed to pass (e.g., penetrate) through some of sub-layers (e.g., the inorganic insulating layers) included in the multi-layer insulating layer MIL, and may have the same depth. In an embodiment, it is shown in FIG. 10A that the recess portion RC and the crack-preventing recess portion GC may each be formed by removing portions of the second interlayer insulating layer 207, the second gate insulating layer 209, and the third interlayer insulating layer 210. In another embodiment, the recess portion RC and the crack-preventing recess portion GC may each be formed by removing portions of the first gate insulating layer 203, the first interlayer insulating layer 205, the second interlayer insulating layer 207, the second gate insulating layer 209, and the third interlayer insulating layer 210.

Referring to FIG. 10B, at least one sacrificial layer 20 and the node connection line 166 may be formed over the substrate 100 over which the recess portion RC and the crack-preventing recess portion GC have been formed. The at least one sacrificial layer 20 and the node connection line 166 may be disposed on the same layer (e.g., the third interlayer insulating layer 210), and may include the same material. The at least one sacrificial layer 20 and the node connection line 166 may include aluminum (Al), copper (Cu), and/or titanium (Ti), and may include a single layer or a multi-layer including the above materials.

The at least one sacrificial layer 20 may be disposed in the first non-display area NDA1. In an embodiment, it is shown in FIG. 10B that the at least one sacrificial layer 20 includes a first sacrificial layer 21, a second sacrificial layer 22, a third sacrificial layer 23, and a fourth sacrificial layer 24. The first sacrificial layer 21 is located between the display area DA and the first partition wall PW1. For example, the first sacrificial layer 21 may be located between the recess portion RC and the first partition wall PW1. The second sacrificial layer 22 may be located between the first partition wall PW1 and the second partition wall PW2, and the third sacrificial layer 23 may be located between the second partition wall PW2 and the third partition wall PW3. The fourth sacrificial layer 24 may be located between the third partition wall PW3 and the crack-preventing recess portion GC.

The widths (e.g., the widths in the x direction) of the first sacrificial layer 21, the second sacrificial layer 22, the third sacrificial layer 23, and the fourth sacrificial layer 24 may be the same or different from each other. In an embodiment, it is shown in FIG. 10A that the widths (e.g., the widths in the x direction) of the first sacrificial layer 21, the second sacrificial layer 22, the third sacrificial layer 23, and the fourth sacrificial layer 24 are the same. In another embodiment, the width of at least one of the first sacrificial layer 21, the second sacrificial layer 22, the third sacrificial layer 23, or the fourth sacrificial layer 24 may be less than those of the rest of the sacrificial layers. In an embodiment, as an example, the width of the fourth sacrificial layer 24 may be less than the width of each of the first sacrificial layer 21, the second sacrificial layer 22, and the third sacrificial layer 23.

At least one sacrificial layer 20 is formed, and then, the first organic insulating layer 211, the data line DL, and the driving voltage line PL may be formed, and the second organic insulating layer 212 may be formed. Then, the first electrode 221, the bank layer 215, and the spacer 217 may be formed.

During a process of forming the first organic insulating layer 211, the second organic insulating layer 212, the bank layer 215, and the spacer 217, at least one partition wall, for example, the first to third partition walls PW1, PW2, and PW3 may be formed. The first partition wall PW1 and the second partition wall PW2 may each include three sub-layers as shown in FIG. 10B. The three sub-layers may include the same material as that of the three layers from among the first organic insulating layer 211, the second organic insulating layer 212, the bank layer 215, and the spacer 217. The third partition wall PW3 may include two sub-layers as shown in FIG. 10B. The two sub-layers may include the same material as that of the two layers from among the first organic insulating layer 211, the second organic insulating layer 212, the bank layer 215, and the spacer 217.

The organic light-emitting diode OLED corresponding to a light-emitting element may be formed in the display area DA. The first electrode 221 may be disposed on the second organic insulating layer 213, and the edges of the first electrode 221 may be covered by the bank layer 215. The emission layer 222b may overlap the first electrode 221, and the second electrode 223 may be formed on the emission layer 222b.

The first and second functional layers 222a and 222c corresponding to the organic material layers 222o may be formed between the first electrode 221 and the second electrode 223. The first and second functional layers 222a and 222c corresponding to the organic material layers 222o may each be formed to be located in the display area DA, the first non-display area NDA1, and the transmissive area TA. The second electrode 230 may be formed to be located in the display area DA, the first non-display area NDA1, and the transmissive area TA.

Next, portions of the first and second functional layers 222a and 222c, and a portion of the second electrode 230 may be removed by irradiating a laser beam LB in a direction facing the upper surface from the lower surface of the substrate 100. The laser beam LB may be irradiated to the first non-display area NDA1, and the laser beam LB may be irradiated a plurality of times while moving in a direction facing the transmissive area TA from the display area DA. In an embodiment, the output of the laser beam LB may be set based on a band gap of the second electrode 223.

A portion of the second electrode 223 arranged in the first non-display area NDA1, and a portion of the capping layer 225 arranged in the first non-display area NDA1 may be removed by the laser beam LB (a laser lift-off process).

FIG. 10C shows the second opening 223oh of the second electrode 223 and the third opening 225oh of the capping layer 225, wherein the second opening 223oh and the third opening 225oh are formed by removing a portion of the second electrode 223 and a portion of the capping layer 225 arranged in the first non-display area NDA1. Each of the second opening 223oh of the second electrode 223 and the third opening 225oh of the capping layer 225 is a single opening located in the first non-display area NDA1. The second opening 223oh and the third opening 225oh may be formed to occupy (e.g., expose) most of the transmissive area TA and the first non-display area NDA1.

During the laser lift-off process, the first to fourth sacrificial layers 21, 22, 23, and 24 may absorb the laser beam and may be heated to a preset temperature, and layers on the first to fourth sacrificial layers 21, 22, 23, and 24 may be removed together with the first to fourth sacrificial layers 21, 22, 23, and 24. In an embodiment, as an example, a portion (for example, a portion of the first functional layer 222a and a portion of the second functional layer 222c) of the organic material layer 222o disposed on the first to fourth sacrificial layers 21, 22, 23, and 24 may be removed. With regard to this, it is shown in FIG. 10C that the first opening 222oh of the organic material layer 222o is included (e.g., is formed).

In the case where the organic material layer 222o includes the first and second functional layers 222a and 222c, the first opening 222oh of the organic material layer 222o may be formed by the opening 222ah of the first functional layer 222a and the opening 222ch of the second functional layer 222c overlapping each other.

The organic material layer 222o includes a plurality of separation portions 222op separated by the first opening 222oh. In the case where the organic material layer 222o includes the first and second functional layers 222a and 222c, the separation portion 222op may include the separation portion 222ap of the first functional layer 222a, and the separation portion 222cp of the second functional layer 222c. The separation portions 222op of the organic material layer 222o may be spaced apart from each other by the first opening 222oh.

Because the first sacrificial layer 21 (see FIG. 10B) closest to the display area DA is arranged between the recess portion RC and the first partition wall PW1, a portion of the organic material layer 222o extended from the display area DA to the first non-display area NDA1 may cover the recess portion RC. The first to third partition walls PW1, PW2, and PW3 may be covered by the separation portion 222op, for example, the separation portion 222ap of the first functional layer 222a and the separation portion 222cp of the second functional layer 222c. The crack-preventing recess portion GC may be also covered by the separation portion 222op.

As described with reference to FIG. 10C, the portions of the organic material layer 222o, the second electrode 223, and the capping layer 225 are removed, and the encapsulation layer 300 and the input sensing layer 400 may be formed.

Referring to FIG. 10D, the first inorganic encapsulation layer 310 of the encapsulation layer 300 may be formed to cover the substrate 100 entirely. The first inorganic encapsulation layer 310 may be formed by chemical vapor deposition. Because the first to fourth sacrificial layers 21, 22, 23, and 24 are removed during the laser lift-off process described above, the first inorganic encapsulation layer 310 may directly contact the exposed upper surface of the third interlayer insulating layer 210.

Because the first inorganic encapsulation layer 310 has a relatively higher step coverage, the first inorganic encapsulation layer 310 may cover the edges 223ep and 225ep of the second electrode 223 and the capping layer 225.

The organic encapsulation layer 320 may be formed by coating a monomer by utilizing an inkjet method and/or the like and then hardening (e.g., curing or polymerizing) the monomer. The organic encapsulation layer 320 may include resin formed while the monomer is hardened. A specific material of the organic encapsulation layer 320 may be the same as described above. The organic encapsulation layer 320 may overlap the edges 223ep and 225ep of the second electrode 223 and the capping layer 225.

The second inorganic encapsulation layer 330 may be formed on the organic encapsulation layer 320. Similar to the first inorganic encapsulation layer 310, the second inorganic encapsulation layer 330 may be formed by the chemical vapor deposition and/or the like. The second inorganic encapsulation layer 330 may directly contact the first inorganic encapsulation layer 310 in a portion of the first non-display area NDA1 and the transmissive area TA in which there is no organic encapsulation layer 320. In an embodiment, as an example, the second inorganic encapsulation layer 330 may directly contact the first inorganic encapsulation layer 310 between the edge 320E of the organic encapsulation layer 320 and the transmissive area TA. Accordingly, possibility of moisture transmission may be reduced or prevented even more.

Then, the first touch insulating layer 410 may be formed, and the first touch conductive layer 420, the second touch insulating layer 430, the second touch conductive layer 440, and the third touch insulating layer 450 may be sequentially formed.

Then, when the transmissive area TA is cut along a cutting line CL by utilizing a laser cutting method and/or the like, the display panel 10 may include the opening 10H formed in the transmissive area TA as shown in FIG. 10E. The structure of FIG. 10E is the same as that described above with reference to FIG. 6.

FIGS. 11A to 11D are cross-sectional images of a region XI of FIG. 10E.

Referring to FIGS. 11A to 11D, the edge 223ep of the second electrode 223 and the edge 225ep of the capping layer 225 may be located (e.g., formed) to have a first height h in the z direction (a direction perpendicular to the upper surface of the third inorganic insulating layer 210) from the upper surface of the third interlayer insulating layer 210. The first height h may be equal to or less than about 2 μm. The edge 223ep of the second electrode 223 and the edge 225ep of the capping layer 225 may curl up from the upper surface of the third interlayer insulating layer 210.

Figure 11A:
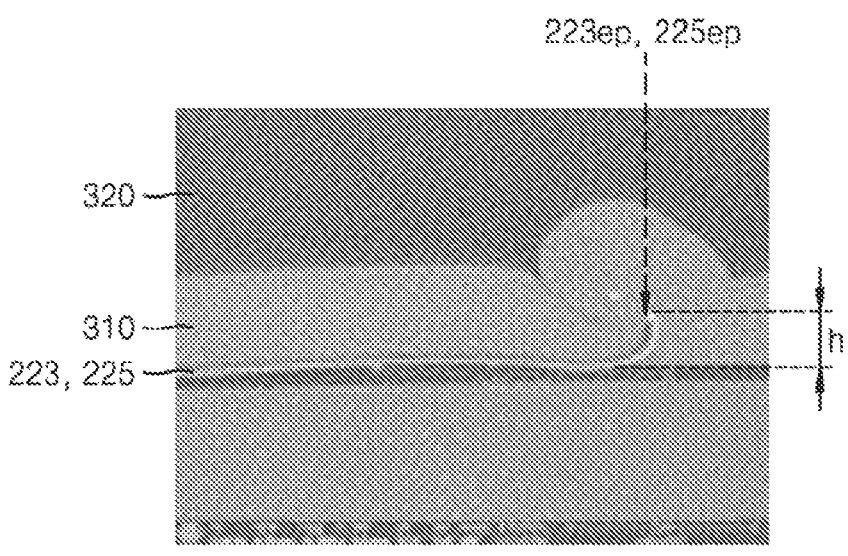
Figure 11B:
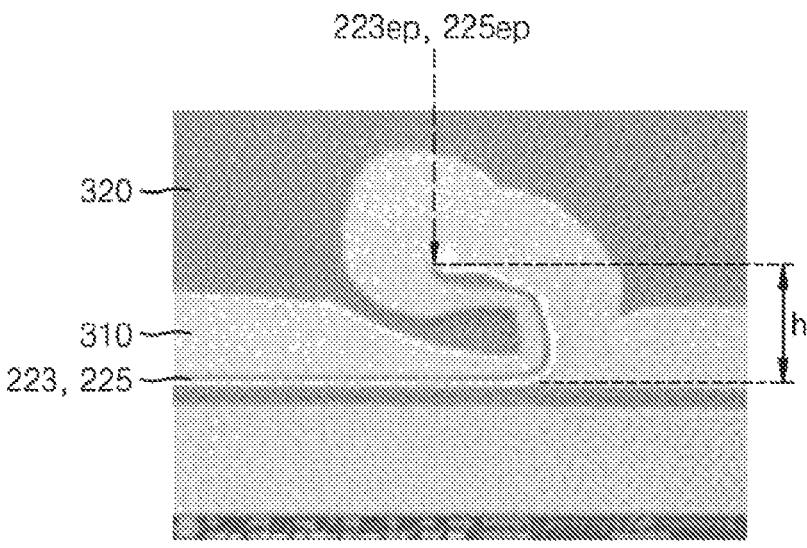
Figure 11C:
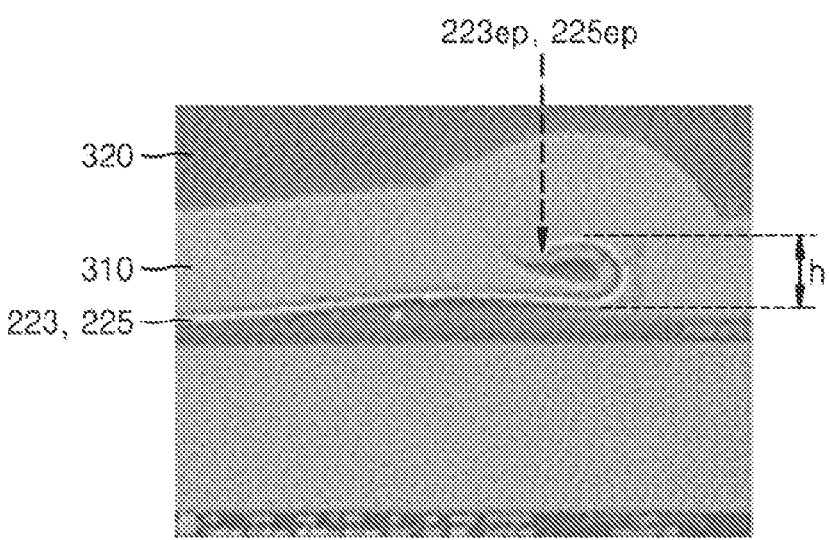
Figure 11D:
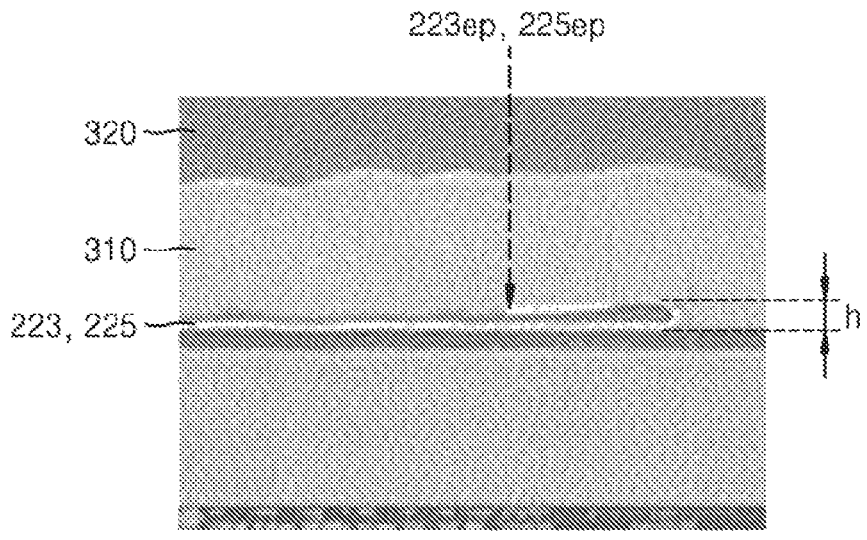

In an embodiment, as an example, as shown in FIG. 11A, the edge 223ep of the second electrode 223 and the edge 225ep of the capping layer 225 may bend to have an approximately (or substantially) L shape, or as shown in FIGS. 11B, 11C, and 11D, may bend to have an approximately (or substantially) C shape.

Because the first inorganic encapsulation layer 310 has a high step coverage, the edge 223ep of the second electrode 223 and the edge 225ep of the capping layer 225 may be covered by the first inorganic encapsulation layer 310 as shown in FIGS. 11A to 11D.

FIG. 12 is a cross-sectional view of a region XII of FIG. 10B.

Referring to FIG. 12, the recess portion RC may prevent or substantially prevent the laser beam LB from being reflected and refracted by the structure (e.g., the second sacrificial layer 22) on the substrate 100 and progressing to the second electrode 223 and the capping layer 225.

As a comparative example, in the case where there is no recess portion RC, the laser beam LB may reach the second electrode 223 and the capping layer 225, and the edge (e.g. end) 223ep of the second electrode 223 and the edge (e.g. end) 225ep of the capping layer 225 may have a height greater than the first height h shown in FIGS. 11A to 11D. In other words, in the case where there is no recess portion RC, the edge 223ep of the second electrode 223 and the edge 225ep of the capping layer 225 may have a height sufficient to pass through the upper surface of the organic encapsulation layer 320. In contrast, according to an embodiment, the positions of the edge 223ep of the second electrode 223 and the edge 225ep of the capping layer 225 may be easily controlled by the recess portion RC.

FIG. 13 is a schematic cross-sectional view of a display panel according to another embodiment, and FIG. 14 is a cross-sectional view of a second display area of a display panel according to another embodiment. A display panel 10' of FIG. 13 is a modification of the display panel 10 of FIG. 6, and is different from the display panel 10 in the third transistor T3, the multi-layer insulating layer MIL, the recess portion RC, and the crack-preventing recess portion GC, while other constructions are the same as those of the display panel 10 of FIG. 6. From among elements shown in FIG. 13, elements having the same reference numerals as those of FIG. 6 denote the same elements, and thus, differences are mainly described below.

Referring to the display area DA of the display panel 10' shown in FIG. 13, the sub-pixel circuit PC and the organic light-emitting diode OLED may be disposed over the substrate 100. As described above with reference to FIG. 4B, the sub-pixel circuit PC may include the plurality of transistors and the storage capacitor. With regard to this, FIG. 13 shows the first transistor T1, the third transistor T3, and the storage capacitor Cst. The first semiconductor layer A1 of the first transistor T1 and the third semiconductor layer A3 of the third transistor T3 may be disposed on the same layer (e.g., the buffer layer 201), and may include the same material.

A plurality of insulating layers are formed between the substrate 100 and the first electrode 221 of the organic light-emitting diode OLED. With regard to this, FIG. 13 shows the buffer layer 201, the first gate insulating layer 203, the first interlayer insulating layer 205, the second interlayer insulating layer 207, the first organic insulating layer 211, and the second organic insulating layer 213. Because the first semiconductor layer A1 and the third semiconductor layer A3 of the third transistor T3 are disposed on the same layer (e.g., the buffer layer 201), the second gate insulating layer 209 (see FIG. 6) and the third interlayer insulating layer 210 (see FIG. 6) described above with reference to FIG. 6 may be omitted.

Referring to the first non-display area NDA1 of FIG. 13, the first to third partition walls PW1, PW2, and PW3 may be spaced apart from each other. The organic material layer 222*o* may include the first openings 222*oh* and the separation portions 222*op* spaced apart from each other by the first openings 222*oh* in the first non-display area NDA1. The second electrode 223 and the capping layer 225 may respectively include the second opening 223*oh* and the third opening 225*oh*.

The first openings 222*oh* and the separation portion 222*op* of the organic material layer 222*o*, the second opening 223*oh* and the edge 223*ep* of the second electrode 223, the third opening 225*oh* and the edge 225*ep* of the capping layer 225 are the same as those described above with reference to FIGS. 6, 11A to 11D.

The recess portion RC and the crack-preventing recess portion GC may be arranged in the first non-display area NDA1. The recess portion RC may be arranged between the edges 223*ep* and 225*ep* of the second electrode 223 and the capping layer 225, and the first partition wall PW1, and the crack-preventing recess portion GC may be arranged between the third partition wall PW3 and the opening 10H (or the transmissive area TA or the first opening 100H of the substrate 100) as described above.

The recess portion RC and the crack-preventing recess portion GC may be formed by removing a portion of the multi-layer insulating layer MIL in the thickness direction of the multi-layer insulating layer MIL. The multi-layer insulating layer MIL may include the buffer layer 201, the first gate insulating layer 203, the first interlayer insulating layer 205, and the second interlayer insulating layer 207. In an embodiment, as an example, the recess portion RC and the crack-preventing recess portion GC may each be formed by removing a portion of the second interlayer insulating layer 207 as shown in FIG. 13. In another embodiment, the recess portion RC and the crack-preventing recess portion GC may each be formed by removing a portion of two or more layers from among the buffer layer 201, the first gate insulating layer 203, the first interlayer insulating layer 205, and the second interlayer insulating layer 207.

The recess portion RC and the crack-preventing recess portion GC of FIG. 13 may be formed concurrently (e.g., simultaneously) during a process of forming the opening OP arranged in the second non-display area NDA2 of the display panel 10' shown in FIG. 14.

Referring to FIG. 14, the multi-layer insulating layer MIL over the substrate 100 is provided also in the second non-display area NDA2. As described above with reference to FIGS. 3A and 3B, the substrate 100 in the sub-region SR, which is a portion of the second non-display area NDA2, may bend. In this case, to facilitate bending, reduce the occurrence of cracks while the display panel bends, or prevent the cracks from propagating, the multi-layer insulating layer MIL may include the opening OP.

The opening OP may be formed by removing a portion of at least one of the sub-layers included in the multi-layer insulating layer MIL. In an embodiment, it is shown in FIG. 14 that the opening OP is formed by removing a portion of the second interlayer insulating layer 207 of the multi-layer insulating layer MIL. The depth of the opening OP of the multi-layer insulating layer MIL may be substantially the same as that of the recess portion RC and the crack-preventing recess portion GC of FIG. 13.

In the display panel according to an embodiment, an issue regarding moisture transmission in the display panel including an opening, and the electronic apparatus including the display panel, and an issue regarding crack occurrence, may be prevented or substantially prevented. Furthermore, the position of the edge of the second electrode of the organic light-emitting diode may be easily (e.g., better) controlled. This effect is provided as an example, and effects according to embodiments are described in more detail in the description above.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About", 'substantially" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A display panel comprising:
a substrate comprising an opening;
a light-emitting element in a display area around the opening and comprising a first electrode, a second electrode, and an intermediate layer between the first electrode and the second electrode;
an organic insulating layer between the substrate and the first electrode of the light-emitting element in the display area;
at least one partition wall in a first non-display area between the display area and the opening;
a multi-layer insulating layer below the at least one partition wall in the first non-display area and below the organic insulating layer in the display area; and
an encapsulation layer on the light-emitting element and comprising at least one inorganic encapsulation layer and an organic encapsulation layer, wherein
the second electrode extends beyond an edge of the organic insulating layer toward the first non-display area from the display area,
the multi-layer insulating layer comprises a recess portion located between an edge of the second electrode and the at least one partition wall in the first non-display area, and
the intermediate layer comprises an emission layer in the display area and an organic material layer extending beyond the emission layer toward the first non-display area.

2. The display panel of claim 1, wherein the multi-layer insulating layer comprises a plurality of inorganic insulating layers.

3. The display panel of claim 1, wherein the organic encapsulation layer overlaps the edge of the second electrode and the recess portion.

4. The display panel of claim 1, wherein a portion of the organic material layer covers the recess portion in the first non-display area.

5. The display panel of claim 4, wherein the organic material layer comprises a plurality of first openings and a plurality of separation portions, wherein the plurality of first openings are spaced apart from each other in the first non-display area, and the plurality of separation portions are separated by the plurality of first openings.

6. The display panel of claim 5, wherein at least one of the plurality of separation portions of the organic material layer covers an upper surface and lateral surfaces of the at least one partition wall.

7. The display panel of claim 1, wherein
the at least one partition wall comprises a first partition wall closest to the display area, and
the recess portion is located between the edge of the second electrode and the first partition wall in the first non-display area.

8. The display panel of claim 7, wherein the at least one partition wall further comprises a second partition wall and a third partition wall, wherein the second partition wall is closer to the opening of the substrate than the first partition wall is to the opening of the substrate, and the third partition wall is closer to the opening of the substrate than the second partition wall is to the opening of the substrate.

9. The display panel of claim 8, wherein the multi-layer insulating layer further comprises a crack-preventing recess portion located between the third partition wall and the opening of the substrate.

10. An electronic apparatus comprising:
a display panel comprising a transmissive area, a display area, and a first non-display area between the transmissive area and the display area; and
a component below the display panel, the component corresponding to the transmissive area,
the display panel comprises:
a substrate having an opening corresponding to the transmissive area;
a light-emitting element in the display area around the opening and comprising a first electrode, a second electrode, and an intermediate layer between the first electrode and the second electrode;
an organic insulating layer between the substrate and the first electrode of the light-emitting element in the display area;
at least one partition wall in the first non-display area between the display area and the opening;
a multi-layer insulating layer below the at least one partition wall in the first non-display area and below the organic insulating layer in the display area, the multi-layer insulating layer comprising a plurality of inorganic insulating layers; and
an encapsulation layer on the light-emitting element and comprising at least one inorganic encapsulation layer and an organic encapsulation layer, wherein
the second electrode extends beyond an edge of the organic insulating layer toward the first non-display area from the display area,
the multi-layer insulating layer comprises a recess portion located between an edge of the second electrode and the at least one partition wall in the first non-display area, and the intermediate layer comprises an emission layer in the display area and an organic material layer extending beyond the emission layer toward the first non-display area.

11. The electronic apparatus of claim 10, wherein the component comprises a camera and/or a sensor.

12. The electronic apparatus of claim 10, wherein the organic encapsulation layer overlaps the edge of the second electrode and the recess portion.

13. The electronic apparatus of claim 10, wherein a portion of the organic material layer covers the recess portion in the first non-display area.

14. The electronic apparatus of claim 13, wherein the organic material layer comprises a plurality of first openings and a plurality of separation portions, wherein the plurality of first openings are spaced apart from each other in the first non-display area, and the plurality of separation portions are separated by the plurality of first openings.

15. The electronic apparatus of claim 14, wherein at least one of the plurality of separation portions of the organic material layer covers an upper surface and lateral surfaces of the at least one partition wall.

16. The electronic apparatus of claim 10, wherein the at least one partition wall comprises a first partition wall closest to the display area, and the recess portion is located between the edge of the second electrode and the first partition wall in the first non-display area.

17. The electronic apparatus of claim 16, wherein the at least one partition wall further comprises a second partition wall and a third partition wall, wherein the second partition wall is closer to the opening of the substrate than the first partition wall is to the opening of the substrate, and the third partition wall is closer to the opening of the substrate than the second partition wall is to the opening of the substrate.

18. The electronic apparatus of claim 17, wherein the multi-layer insulating layer further comprises a crack-preventing recess portion located between the third partition wall and the opening of the substrate.

19. A method of manufacturing a display panel, the method comprising:

preparing a substrate comprising a transmissive area, a display area, and a first non-display area between the transmissive area and the display area;

forming a multi-layer insulating layer on the substrate, the multi-layer insulating layer comprising a plurality of inorganic insulating layers;

forming a recess portion indented in a thickness direction of the multi-layer insulating layer and located in the first non-display area;

forming a light-emitting element comprising a first electrode, a second electrode, and an intermediate layer between the first electrode and the second electrode, wherein an organic material layer of the intermediate layer and the second electrode are formed in the display area and the first non-display area;

forming at least one partition wall in the first non-display area;

forming an encapsulation layer on the light-emitting element and comprising at least one inorganic encapsulation layer and an organic encapsulation layer; and removing at least a portion of the organic material layer and a portion of the second electrode arranged in the first non-display area, wherein an edge of the second electrode is located in the first non-display area, and the recess portion is between the edge of the second electrode and the at least one partition wall.

20. The method of claim 19, wherein the removing comprises irradiating a laser beam.

21. The method of claim 19, wherein the removing comprises forming a plurality of first openings of the organic material layer by removing portions of the organic material layer located in the first non-display area, and wherein the organic material layer comprises a plurality of separation portions separated from each other by the plurality of first openings.

22. The method of claim 21, wherein the at least one partition wall comprises a plurality of partition walls spaced apart from each other in the first non-display area, and wherein one of the plurality of first openings is located between adjacent partition walls from among the plurality of partition walls.

23. The method of claim 22, wherein a first opening closest to the display area from among the plurality of first openings is located between the recess portion and the at least one partition wall.

24. The method of claim 19, wherein the forming of the encapsulation layer comprises:

forming a first inorganic encapsulation layer in the display area and the first non-display area;

forming the organic encapsulation layer on the first inorganic encapsulation layer; and forming a second inorganic encapsulation layer on the organic encapsulation layer, wherein the organic encapsulation layer overlaps the edge of the second electrode and the recess portion.

25. The method of claim 19, wherein the forming of the recess portion comprises forming a crack-preventing recess portion located between the at least one partition wall and the transmissive area.

* * * * *